(12) United States Patent
Yoshitomi et al.

(10) Patent No.: US 11,804,387 B2
(45) Date of Patent: *Oct. 31, 2023

(54) SUBSTRATE PROCESSING DEVICE AND SUBSTRATE PROCESSING METHOD

(71) Applicant: SCREEN Holdings Co., Ltd., Kyoto (JP)

(72) Inventors: Daichi Yoshitomi, Kyoto (JP); Kazuki Inoue, Kyoto (JP); Masaki Iwami, Kyoto (JP); Hiroaki Ishii, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 203 days.

This patent is subject to a terminal disclaimer.

(21) Appl. No.: 17/219,887

(22) Filed: Apr. 1, 2021

(65) Prior Publication Data

US 2021/0217637 A1 Jul. 15, 2021

Related U.S. Application Data

(60) Division of application No. 16/005,057, filed on Jun. 11, 2018, now Pat. No. 10,998,203, which is a
(Continued)

(30) Foreign Application Priority Data

Mar. 27, 2015 (JP) .................... 2015-066259
Mar. 27, 2015 (JP) .................... 2015-066266
(Continued)

(51) Int. Cl.
  *H01L 21/67* (2006.01)
  *H01L 21/687* (2006.01)

(52) U.S. Cl.
  CPC .. *H01L 21/67051* (2013.01); *H01L 21/68728* (2013.01); *H01L 21/68785* (2013.01)

(58) Field of Classification Search
  None
  See application file for complete search history.

(56) References Cited

U.S. PATENT DOCUMENTS 5,677,000 A  10/1997  Yoshioka et al. ............. 427/240
6,220,771 B1  4/2001  Tung et al.
(Continued)

FOREIGN PATENT DOCUMENTS

CN  102214548 A  10/2011
CN  103367202 A  10/2013
(Continued)

OTHER PUBLICATIONS

Notice of Opinion for the First Periodic Review with Search Report dated Sep. 7, 2022 in counterpart Chinese Patent Application No. 201910950303.2 and machine English translation.
(Continued)

*Primary Examiner* — Cristi J Tate-Sims
(74) *Attorney, Agent, or Firm* — OSTROLENK FABER LLP

(57) ABSTRACT

A substrate processing device includes a holding member for holding a substrate, and an opposed member having a body portion and an extended portion extending from at least a part of a peripheral edge part of the body portion. A protrusion is provided on one part of a tip side part of the extended portion and a side surface part of the holding member, and the other part is provided with a restricting structure disposed opposite to the protrusion and restricting relative motion of the protrusion. The relative motion between the holding member and the opposed member is restricted, and the substrate processing device further includes a rotating mechanism, and a nozzle for discharging
(Continued)

a processing solution and the protrusion and the restricting structure are disposed below an upper surface of the holding member.

6 Claims, 18 Drawing Sheets

Related U.S. Application Data continuation of application No. 15/062,341, filed on Mar. 7, 2016, now Pat. No. 10,037,902.

(30) Foreign Application Priority Data

Mar. 27, 2015 (JP) ................................ 2015-066268
Mar. 27, 2015 (JP) ................................ 2015-066332

(56) References Cited

U.S. PATENT DOCUMENTS

| | | | |
|---|---|---|---|
| 6,794,291 B2 | 9/2004 | Peace et al. | 438/694 |
| 7,217,325 B2 | 5/2007 | Hanson | 118/52 |
| 8,734,593 B2 | 5/2014 | Kishimoto et al. | 134/33 |
| 8,869,811 B2 | 10/2014 | Ogata et al. | |
| 9,460,941 B2 | 10/2016 | Nishiyama | |
| 9,555,437 B2 | 1/2017 | Nakai et al. | |
| 2002/0179120 A1 | 12/2002 | Ono et al. | |
| 2003/0201003 A1 | 10/2003 | Ono et al. | |
| 2004/0211959 A1 | 10/2004 | Kajita et al. | |
| 2006/0102289 A1 | 5/2006 | Fukatsu | |
| 2008/0066786 A1 | 3/2008 | Hsieh et al. | 134/34 |
| 2008/0110861 A1 | 5/2008 | Kajita et al. | |
| 2011/0048469 A1 | 3/2011 | Ogata et al. | |
| 2011/0240067 A1 | 10/2011 | Kishimoto et al. | |
| 2011/0240601 A1 | 10/2011 | Hashizume et al. | |
| 2011/0303246 A1 | 12/2011 | Stiyer et al. | 134/34 |
| 2011/0308647 A1 | 12/2011 | Collins et al. | 137/561 A |
| 2013/0014786 A1 | 1/2013 | Ito | |
| 2013/0255031 A1 | 10/2013 | Nishiyama | |
| 2013/0260574 A1 | 10/2013 | Masuhara et al. | |
| 2014/0041689 A1 | 2/2014 | Namba | |
| 2014/0060423 A1 | 3/2014 | Nakai et al. | 115/50 |
| 2014/0116478 A1 | 5/2014 | Higashijima et al. | |
| 2014/0202989 A1 | 7/2014 | Kishimoto et al. | 216/83 |
| 2014/0227883 A1 | 8/2014 | Izumoto | |
| 2014/0261163 A1 | 9/2014 | Kishita et al. | 118/52 |
| 2014/0290703 A1 | 10/2014 | Kobayashi et al. | |
| 2015/0040951 A1 | 2/2015 | Yoshizumi et al. | 134/26 |
| 2015/0090301 A1* | 4/2015 | Higuchi | H01L 21/67051 134/104.1 |
| 2015/0234296 A1 | 8/2015 | Yagi | |
| 2016/0042980 A1 | 11/2016 | Ohashi | |
| 2017/0053815 A1 | 2/2017 | Izumoto et al. | |
| 2017/0098553 A1 | 4/2017 | Nakai et al. | |

FOREIGN PATENT DOCUMENTS

| | | |
|---|---|---|
| CN | 103681237 A | 3/2014 |
| CN | 103996598 A | 8/2014 |
| JP | H05-259060 A | 10/1993 |
| JP | H08-001064 A | 1/1996 |
| JP | H09-117708 A | 5/1997 |
| JP | H09-330904 A | 12/1997 |
| JP | H10-5668 A | 1/1998 |
| JP | H10-223591 A | 8/1998 |
| JP | H11-033468 A | 2/1999 |
| JP | 11-102882 | 4/1999 |
| JP | 11102882 A | 4/1999 |
| JP | H11-330041 A | 11/1999 |
| JP | 2000-124181 A | 4/2000 |
| JP | 2000-156362 A | 6/2000 |
| JP | 2001-196344 A | 7/2001 |
| JP | 2001-300400 A | 10/2001 |
| JP | 2002-177854 | 6/2002 |
| JP | 2003-047903 A | 2/2003 |
| JP | 2003-282514 A | 10/2003 |
| JP | 2004-235216 A | 8/2004 |
| JP | 2004-273852 A | 9/2004 |
| JP | 2007-523463 A | 8/2007 |
| JP | 2008-227386 A | 9/2008 |
| JP | 2009-283632 A | 12/2009 |
| JP | 2009-295803 A | 12/2009 |
| JP | 2010-056218 | 3/2010 |
| JP | 2011-211094 | 10/2011 |
| JP | 2013-077595 A | 4/2013 |
| JP | 2014-067778 | 4/2014 |
| JP | 2014-067780 | 4/2014 |
| JP | 2014-086638 A | 5/2014 |
| JP | 2014-179491 A | 9/2014 |
| JP | 2014-183121 A | 9/2014 |
| JP | 2014-194965 A | 10/2014 |
| JP | 2015-035474 A | 2/2015 |
| JP | 2015-153947 A | 8/2015 |
| KR | 10-0253976 B1 | 4/2000 |
| KR | 10-2002-0091746 | 12/2002 |
| KR | 10-2014-0030034 | 3/2014 |
| TW | 201126630 | 8/2011 |
| TW | 201340190 | 10/2013 |
| TW | 201420201 | 6/2014 |
| TW | 201442105 | 11/2014 |
| TW | 201501194 | 1/2015 |

OTHER PUBLICATIONS

Second Office Action with Search Report dated Mar. 31, 2023 in corresponding Chinese Patent Application No. 201910950303.2 and computer generated English translation made from the Japanese translation of the original communication.
Decision to Grant a Patent dated May 29, 2018 issued in corresponding Japanese Patent Application No. 2015-066268.
Office Action dated Apr. 3, 2018 issued in counterpart Chinese Patent Application No. 2016101689947 with Japanese translation and English translation based on the Japanese translation. Portions relevant to prior-art based rejections are translated.
Office Action dated Feb. 23, 2018 in counterpart Korean Patent Application No. 10-2016-0035352 with Japanese translation and English translation based on the Japanese translation. Portions relevant to prior-art based rejections are translated.
Korean Office Action (Application No. 10-2016-0035352) dated Aug. 11, 2017 with English translation based on Japanese translation. Portions relevant to prior-art based rejections are translated.
Taiwanese Office Action dated Jul. 18, 2017 with Japanese translation and English translation of portions relevant to prior-art based rejections based on Japanese translation.
Office Action dated Dec. 21, 2018 in counterpart Chinese Patent Application No. 2016101689947 with Japanese translation and partial English translation based on the Japanese translation.
Korean Office Action dated Aug. 22, 2018 in counterpart Korean Application No. 10-2016-0035352 and English translation thereof based on the Japanese translation. Portions relevant to prior-art based rejections are translated.
Notice of Resons for Refusal dated Jun. 18, 2019 in counterpart Japanese Patent Application No. 2018-201704 with English translation obtained from One Portal Dossier.
Decision to Grant a Patent dated Aug. 6, 2019 in counterpart Japanese Patent Application No. 2015-066259.
Office Action dated Feb. 1, 2019 in counterpart Korean Patent Application No. 10-2019-0002226 with Japanese translation and English translation based on the Japanese translation. Portions relevant to prior-art based rejections are translated.
Office Action dated Oct. 2, 2018 in counterpart Japanese Application No. 2015-066259.
Japanese Decision to Grant a Patent dated Oct. 2, 2018 in counterpart Japanese Application No. 2015-066332.
Notification of Reason(s) for Refusal dated Mar. 12, 2019 in counterpart Japanese Patent Application No. 2015-066259 with partial English translation. Portions relevant to prior-art based rejections are translated.

(56) References Cited

OTHER PUBLICATIONS

Office Action (Notification of Reason(s) for Refusal) dated Oct. 2, 2018 in counterpart Japanese Patent Application No. 2015-066266 with partial English translation. Portions relevant to the prior-art based rejections are translated.

* cited by examiner

F I G. 7
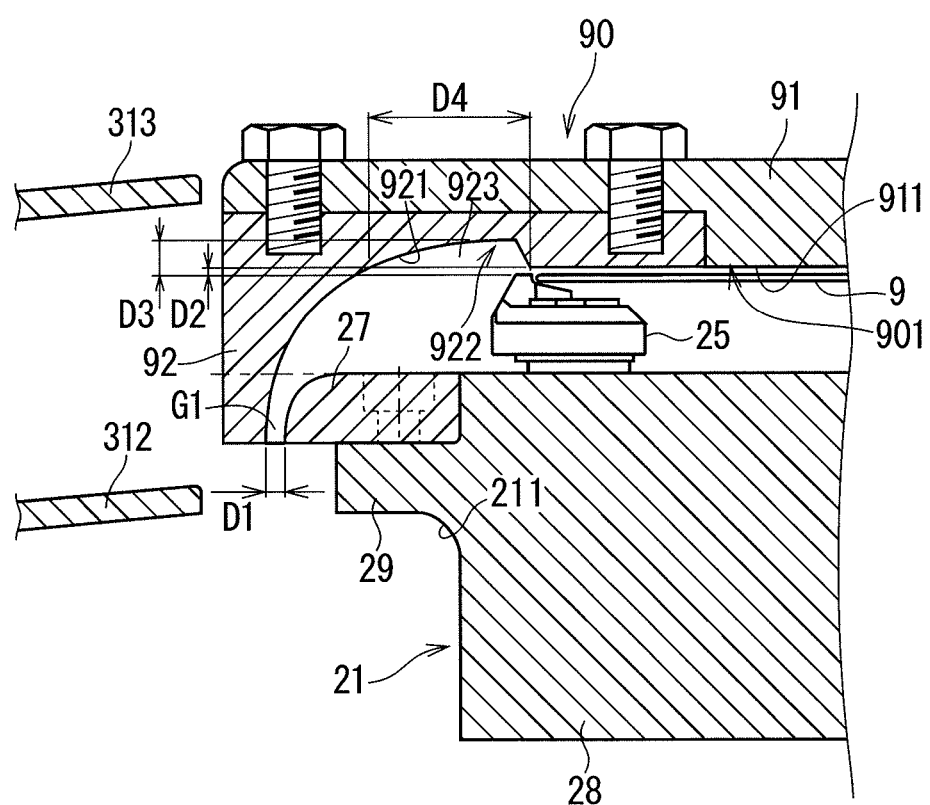

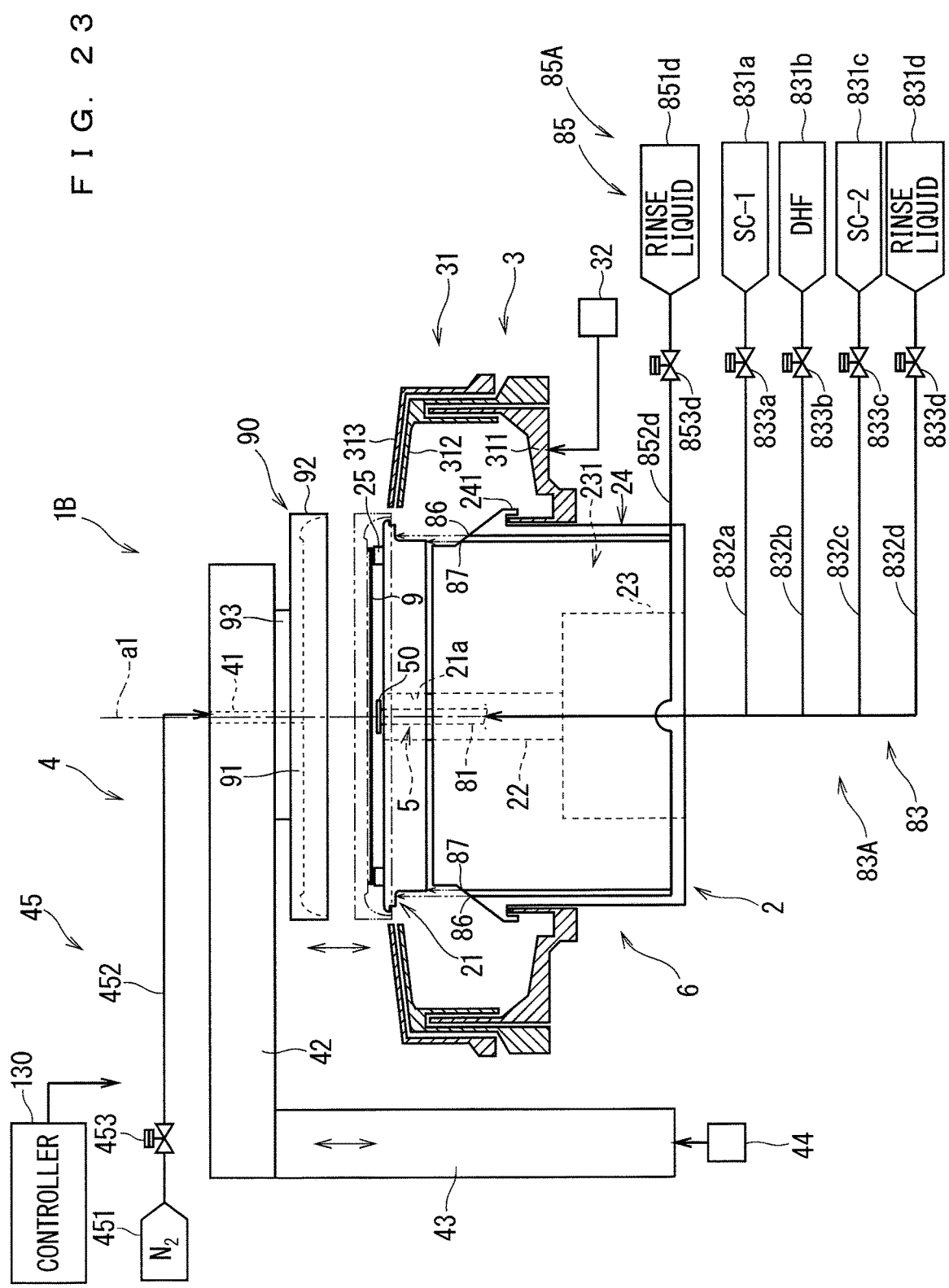
F I G. 2 3

SUBSTRATE PROCESSING DEVICE AND SUBSTRATE PROCESSING METHOD

CROSS-REFERENCE TO RELATED APPLICATIONS

The present patent application is a divisional of prior U.S. patent application Ser. No. 16/005,057, filed Jun. 11, 2018, by Daichi YOSHITOMI, Kazuki INOUE, Masaki IWAMI and Hiroaki ISHII, entitled "SUBSTRATE PROCESSING DEVICE AND SUBSTRATE PROCESSING METHOD," which is a continuation of U.S. patent application Ser. No. 15/062,341, filed Mar. 7, 2016, now U.S. Pat. No. 10,037,902 B2, issued Jul. 31, 2018, which claims priority to Japanese Patent Application Nos. 2015-066259, filed Mar. 27, 2015, 2015-066266, filed Mar. 27, 2015, 2015-066268, filed Mar. 27, 2015 and 2015-066332, filed Mar. 27, 2015. The contents of each of the patent applications listed above are incorporated in full herein by reference.

BACKGROUND OF THE INVENTION

Field of the Invention

The present invention relates to a substrate processing technology for performing a processing over a semiconductor wafer, a glass substrate for a liquid crystal display, a glass substrate for a plasma display, a substrate for an optical disk, a substrate for a magnetic disk, a substrate for a magneto-optical disk, a glass substrate for a photomask, a substrate for a solar cell or the like (which will simply be hereinafter referred to as a "substrate").

Description of the Background Art

As a substrate processing device for performing such a processing, Japanese Patent Application Laid-Open Nos. 2014-67778 and 2014-67780 disclose a device for supplying a processing solution to a substrate and processing the substrate while rotating a holding member for holding the substrate horizontally from below and a shielding plate opposed to an upper surface of the substrate. The shielding plate is slightly larger than the substrate and is disposed to cover the substrate in an upper close position of the substrate. A tip part of a first engaging portion protruded downward from a peripheral edge part of the shielding plate and a tip part of a second engaging portion protruded upward from a peripheral edge part of the holding member are engaged with each other in a position between the substrate and the holding member. A rotational drive rotates the holding member with the holding member and the shielding plate thus engaged with each other. Consequently, the shielding plate is rotated and driven at an equal rotating speed in the same rotating direction as the holding member so that refuse or mist is prevented from sticking to the upper surface of the substrate.

Moreover, Japanese Patent Application Laid-Open No. 2010-56218 discloses a device including a holding member for holding a substrate horizontally from below and a shielding plate opposed to an upper surface of the substrate and supplying a processing solution to a to-be-processed surface of the substrate to process the substrate while rotating the holding member and the shielding plate respectively. The shielding plate is provided in order to shield an atmosphere of a surface of the substrate from an external atmosphere thereof. The shielding plate is slightly larger than the substrate and is disposed to cover the substrate above the substrate. The shielding plate has an opposed surface which is opposed to the upper surface of the substrate and a peripheral wall portion. The peripheral wall portion is protruded downward from a peripheral edge part of the shielding plate and surrounds a whole circumference of the peripheral edge part of the substrate. A tip edge of the peripheral wall portion is positioned closer to the holding member than the substrate held by the holding member. An inner peripheral surface of the peripheral wall portion takes a shape such as a side surface of a truncated cone which has an opposed surface to be an upper surface and a diameter thereof is gradually increased to approach the tip edge side from the opposed surface side. The processing solution emitted to the substrate is discharged from the surface of the substrate by the rotation of the substrate and is discharged from a clearance between a peripheral edge part of an upper surface of the holding member and a tip edge of the shielding plate.

Furthermore, Japanese Patent Application Laid-Open No. 2011-211094 discloses a device including a holding member for horizontally holding a substrate from below and a disk-shaped nozzle provided between the holding member and the substrate. The disk-shaped nozzle is opposed to a central part of a lower surface of a substrate W. The device discharges a processing solution from the disk-shaped nozzle toward a central part of the lower surface of the substrate while rotating the holding member. The discharged processing solution is moved from the central part of the lower surface to a peripheral edge part and is thus discharged from the peripheral edge part to an outside of the substrate in order to cover the whole lower surface of the substrate by centrifugal force. Consequently, the whole lower surface of the substrate is processed.

In addition, Japanese Patent Application Laid-Open No. 11-102882 (1999) discloses a device including a spin base (a "holding member") to be rotated while holding a substrate substantially horizontally by a chuck pin, a cover member opposed in parallel with a predetermined interval formed from an upper surface of the substrate, and a nozzle for selectively supplying hydrofluoric acid, pure water or the like to the upper surface of the substrate via a through hole provided on a central part of the cover member. Moreover, the device further includes a cylindrical processing cup having a bottom face. The spin base is rotatably supported above the bottom face of the processing cup. The device further includes a cylindrical guard. The guard is provided along an inner peripheral surface of a side wall of the processing cup and surrounds the spin base. The guard is moved upward and downward between predetermined lower and upper positions by a driving mechanism. A solution supplied from the nozzle to the substrate in the processing of the substrate sticks to a side surface of the spin base in discharge from the substrate. Therefore, the device further includes a cleaning nozzle for cleaning the side surface of the spin base. The cleaning nozzle is provided on the bottom face of the processing cup apart from the spin base outward in a radial direction. The cleaning nozzle discharges a cleaning liquid obliquely upward toward the side surface of the spin base and cleans the side surface of the spin base.

Referring to the devices disclosed in the Japanese Patent Application Laid-Open Nos. 2014-67778 and 2014-67780, however, a connecting part of the first and second engaging portions for engaging the shielding plate with the holding member is provided above the holding member. For this reason, there is a problem in that the processing solution supplied to the to-be-processed surface of the substrate and discharged from the peripheral edge part of the substrate to the outside by centrifugal force is splashed back toward the substrate side by a joint of the connecting part or the like and thus sticks to a surface ("a non-processed surface") other than the to-be-processed surface of the substrate, resulting in generation of a defect such as a particle.

Referring to the device disclosed in the Japanese Patent Application Laid-Open No. 2010-56218, furthermore, there is a small annular space between the inner peripheral surface of the peripheral wall portion and the peripheral edge part of the substrate in the space surrounded by the shielding plate and the holding member. For this reason, there is a problem in that the processing solution discharged from the substrate and splashed back by the inner peripheral surface of the peripheral wall portion reaches the non-processed surface of the substrate and sticks thereto, resulting in generation of a defect on the substrate.

Referring to the device disclosed in the Japanese Patent Application Laid-Open No. 2011-211094, moreover, there is a problem in that a part of the processing solution discharged to the lower surface of the substrate drops and sticks onto the upper surface of the holding member from the lower surface of the substrate and remains as it is.

In addition, the upper end part of the guard is usually extended obliquely upward toward a rotating shaft of the spin base. The substrate processing device disclosed in the Japanese Patent Application Laid-Open No. 11-102882 (1999) supplies the solution from the nozzle to the substrate with the guard disposed in an upper position. The supplied solution scatters in the discharge from the substrate and also sticks to the inner peripheral surface of the guard. When the processing is repeated in a state in which the sticking solution remains, a deposit obtained by drying and solidifying the solution is gradually accumulated on the guard. When such a deposit is peeled, a particle is caused. Since the upper end part of the guard is close to the substrate, the deposit sticking to the upper end part tends to cause the particle.

Referring to the device disclosed in the Japanese Patent Application Laid-Open No. 11-102882 (1999), however, there is a problem in that the inner peripheral surface of the guard cannot be cleaned by the cleaning nozzle for cleaning the side surface of the spin base. Furthermore, there is a problem in that a structure of the device is complicated and a manufacturing cost is thus increased if a dedicated cleaning nozzle for discharging the cleaning liquid toward the inner peripheral surface of the guard is further provided, for example. In order to effectively suppress the particle, moreover, it is effective to clean the solution sticking to the inner peripheral surface of the upper end part of the guard. However, there is a problem in that the cleaning liquid scatters from the upper end part of the guard toward the substrate side and thus sticks to the substrate when the cleaning nozzle discharges the cleaning liquid from below toward the inner peripheral surface of the upper end part in the state in which the spin base holds the substrate. In addition, there is also a problem in that the guard needs to be cleaned after the substrate is retreated from the spin base if the sticking of the cleaning liquid is to be avoided.

SUMMARY OF THE INVENTION

The present invention is directed to a substrate processing device.

A substrate processing device according to an aspect of the present invention includes: a holding member having an upper surface opposed to a lower surface of a substrate with a clearance to hold the substrate substantially horizontally from below, being rotatable around a predetermined rotation axis; and an opposed member having a body portion opposed, with a clearance, to an upper surface of the substrate held by the holding member and an extended portion extending from at least a part of a peripheral edge part of the body portion to a side of the holding member, being rotatable around the rotation axis, wherein a protrusion is provided in one part of a tip side part of the extended portion and a side surface part of the holding member, and the other part is provided with a restricting structure disposed opposite to the protrusion from ahead of and behind the protrusion in a circumferential direction around the rotation axis, said restricting structure restricting relative motion of said protruded portion in the circumferential direction, and the holding member and the opposed member mutually restrict relative motion therebetween in the circumferential direction around the rotation axis through the protrusion and the restricting structure, and the substrate processing device further includes: a rotating mechanism rotating at least one of the holding member and the opposed member around the rotation axis; and a nozzle discharging a processing solution to a to-be-processed surface of the substrate which is held by the holding member and is being rotated, wherein the protrusion and the restricting structure are disposed below an upper surface of the holding member.

In the device, the extended portion extends from the peripheral edge part of the body portion of the opposed member to the side of the holding member. The protrusion is provided in one part of the tip side part of the extended portion and the side surface part of the holding member, and furthermore, the restricting structure is provided in the other part and the protrusion and the restricting structure are disposed below the upper surface of the holding member. Accordingly, the processing solution discharged from the substrate can be prevented from being splashed back by the protrusion or the restricting structure, thereby sticking to the non-processed surface of the substrate.

A substrate processing device according to another aspect of the present invention includes: a holding member having an upper surface opposed to a lower surface of a substrate with a clearance to hold the substrate substantially horizontally from below, being rotatable around a predetermined rotation axis; an opposed member having a body portion opposed, with a clearance, to an upper surface of the substrate held by the holding member and a cylindrical extended portion which extends from a peripheral edge part of the body portion to the holding member side to surround an end face of the substrate being rotatable around the rotation axis; a rotating mechanism rotating the holding member and the opposed member together in a same direction around the rotation axis; and a nozzle discharging a processing solution to a to-be-processed surface of any one of an upper surface and a lower surface of the substrate which is held by the holding member and is being rotated, wherein the opposed member includes an annular recess formed in a portion of an inside surface of said opposed member surrounding the upper surface and the end face of said substrate, the portion of the inside surface being disposed between a tip side part of the extended portion and an opposed surface of the inside surface opposed to the substrate, and the annular recess is recessed upward relative to a peripheral edge part of the opposed surface.

In the device, the opposed member includes the annular recess which is recessed upward from the peripheral edge part of the opposed portion in a portion between the tip side part of the extended portion and the opposed surface of said inside surface opposed to the substrate in the inside surface surrounding the upper surface and the end face of the substrate. Consequently, an annular bulged space which is bulged upward from the opposed part is formed on the outside of the peripheral edge part of the substrate. Therefore, the processing solution discharged from the substrate and then splashed back from the inner peripheral surface of the extended portion can be prevented from sticking to the non-processed surface of the substrate.

A substrate processing device according to further another aspect of the present invention includes: a holding member having an upper surface opposed to a lower surface of a substrate with a clearance to hold the substrate substantially horizontally from below, being rotatable around a predetermined rotation axis, and including a disk-shaped base defining a central axis coincident with the rotation axis and a flange portion protruding outward from a peripheral wall portion of the base in a radial direction; a rotational drive rotating the holding member around the rotation axis; a guard having a cylindrical shape including an upper end side part that extends obliquely upward toward the rotation axis, to surround a periphery of the holding member, being movable upward and downward; a processing solution discharging portion capable of discharging a processing solution to a to-be-processed surface of the substrate; a cleaning liquid discharging portion capable of discharging a cleaning liquid to the flange portion from below the flange portion of the holding member; an elevation drive capable of moving the guard upward and downward between an upper position where the guard can receive the processing solution supplied from the processing solution discharging portion to the substrate and then discharged from the substrate and a lower position where an upper end of the guard is placed on a side of the flange portion; and a controller controlling the elevation drive, the processing solution discharging portion and the cleaning liquid discharging portion, wherein while making the elevation drive dispose the guard in the upper position, the controller makes the processing solution discharging portion discharge the processing solution toward the to-be-processed surface of the substrate to process the substrate, and then while making the elevation drive dispose the guard in the lower position, the controller makes the cleaning liquid discharging portion discharge the cleaning liquid toward the flange portion of the holding member which holds the substrate while rotating.

In the device, the processing solution discharging portion discharges the processing solution toward the to-be-processed surface of the substrate while the guard is disposed in the upper position where guard can receive the processing solution discharged from the substrate. While the guard is disposed in the lower position where the upper end of the guard is placed on the side of the flange portion of the holding member, then, the cleaning liquid discharging portion discharges the cleaning liquid toward the flange portion of the holding member which holds the substrate while rotating. The discharged cleaning liquid is discharged outward in the radial direction of the holding member from the lower surface of the flange portion. The upper end of the guard disposed in the lower position is positioned on the side of the flange portion. Therefore, the discharged processing solution hits the inner peripheral surface of the upper end part of the guard. In the state in which the substrate is held by the holding member, consequently, both the guard and the holding member which have the processing solution sticking thereto can be cleaned by the common cleaning liquid discharging portion.

Therefore, it is an object of the present invention to provide a technology capable of preventing a processing solution supplied to a substrate and discharged from the substrate to an outside from sticking to a non-processed surface of the substrate. Moreover, it is another object of the present invention to provide a technology capable of preventing a processing solution supplied to a lower surface of a substrate which is held by a holding member and is being rotated from dropping and sticking onto the holding member and remaining as it is. Furthermore, it is further another object of the present invention to provide a technology capable of cleaning both a guard and a holding member by a common cleaning liquid discharging portion in a state in which the holding member holds a substrate.

In the present invention, the term "to-be-processed surface" means a surface that is subject to be processed ("a surface to be processed"). In the event that the processing with a processing solution is to be performed on a major surface, the major surface represents "to-be-processed surface" of the invention.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is another longitudinal sectional view showing the peripheral edge parts of the shielding plate and the spin base in FIG. 2;

FIG. 23 is a schematic view for explaining a structure of a substrate processing device according to a third preferred embodiment of the present invention;

DESCRIPTION OF THE PREFERRED EMBODIMENTS

Preferred embodiments will be described below with reference to the drawings. The following preferred embodiments are examples for concreteness of the present invention and are not the cases that restrict the technical range of the present invention. In each of the figures to be referred to, moreover, dimensions and numbers of respective portions are shown with exaggeration or simplification in some cases for easy understanding. A vertical direction is a perpendicular direction and a substrate side with respect to a spin base is an upper part.

1. Referring to First Preferred Embodiment

<1-1. Structure of Substrate Processing Device 1>

Figure 1:
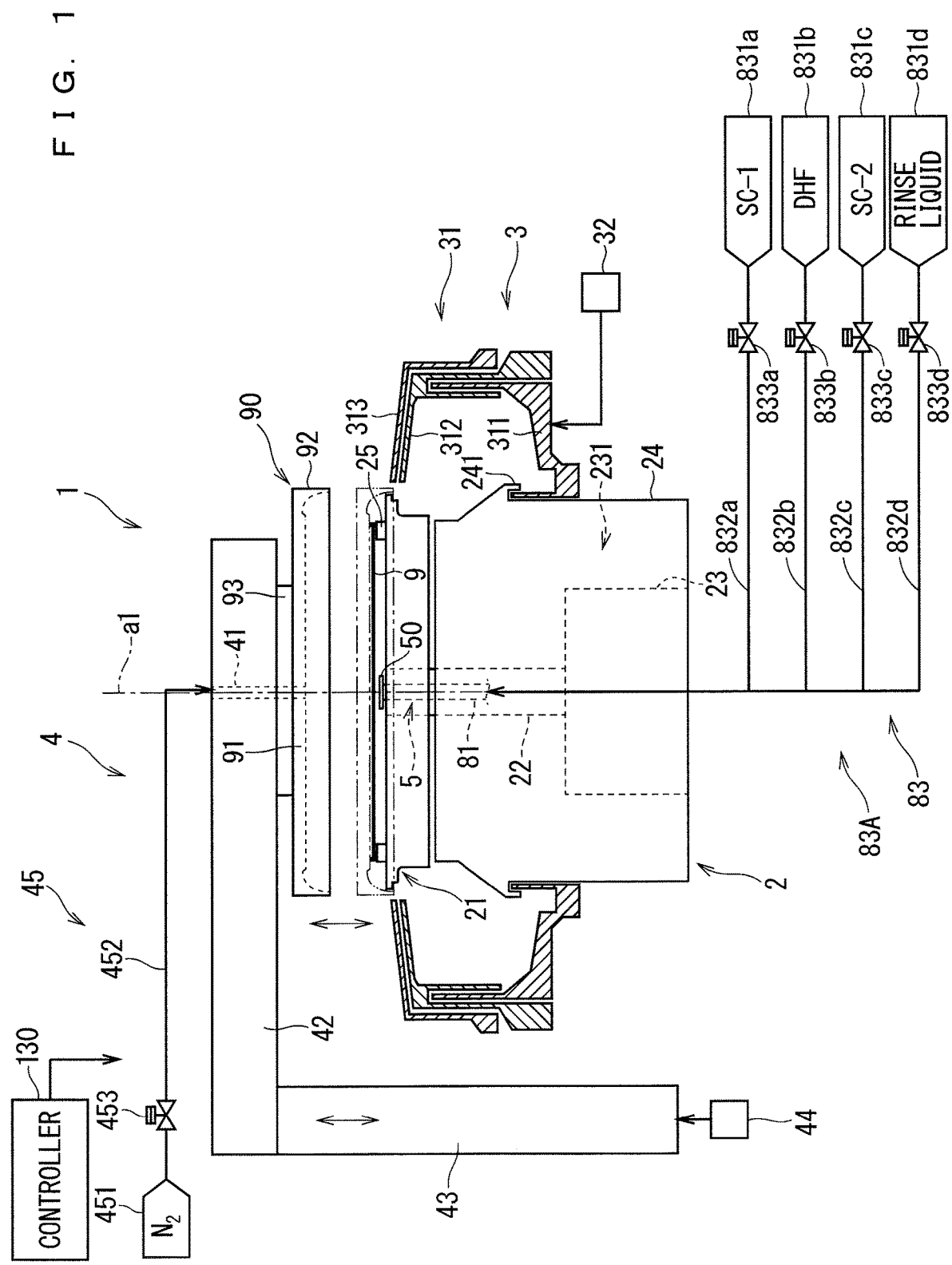
FIG. 1 is a schematic view for explaining a structure of a substrate processing device according to a first preferred embodiment of the present invention.
Figure 2:
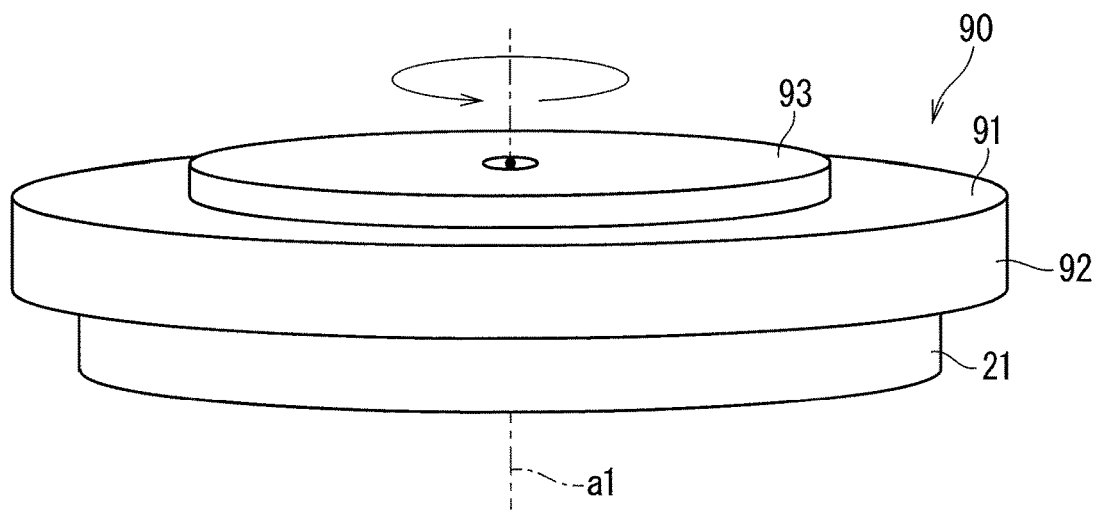
FIG. 2 is a perspective view showing a shielding plate and a spin base in FIG. 1 which are disposed in a processing position.
Figure 3:
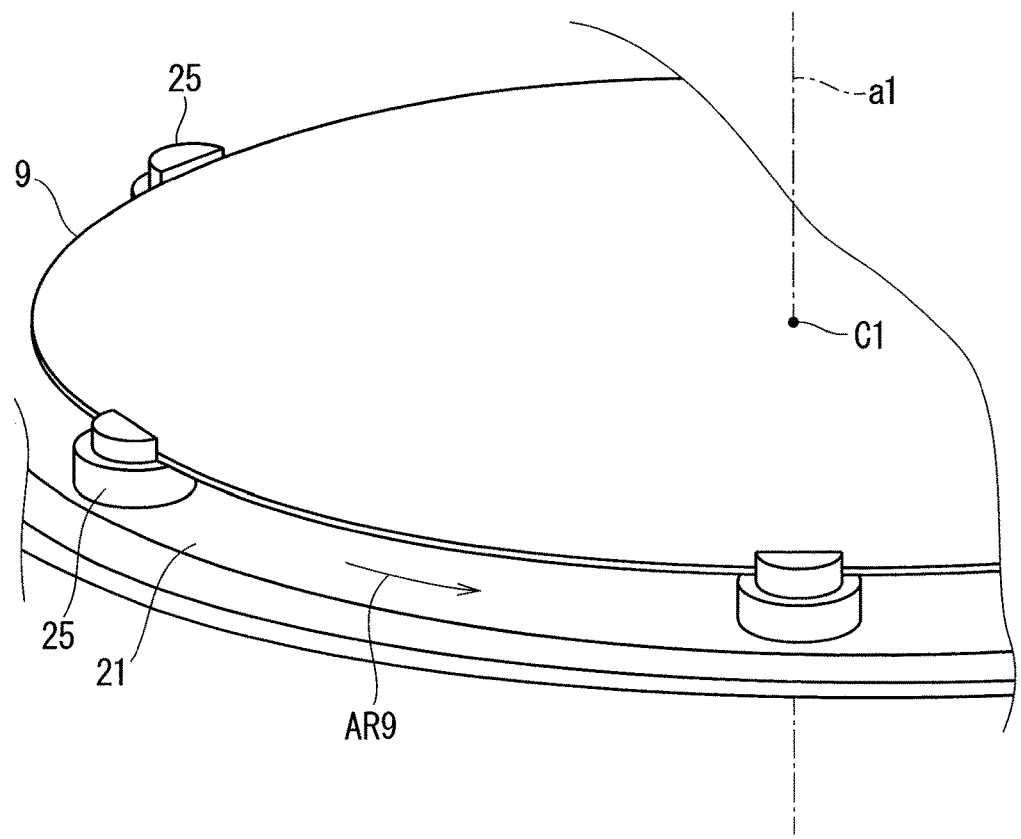
FIG. 3 is a perspective view showing the spin base in FIG. 2.
Figure 4:
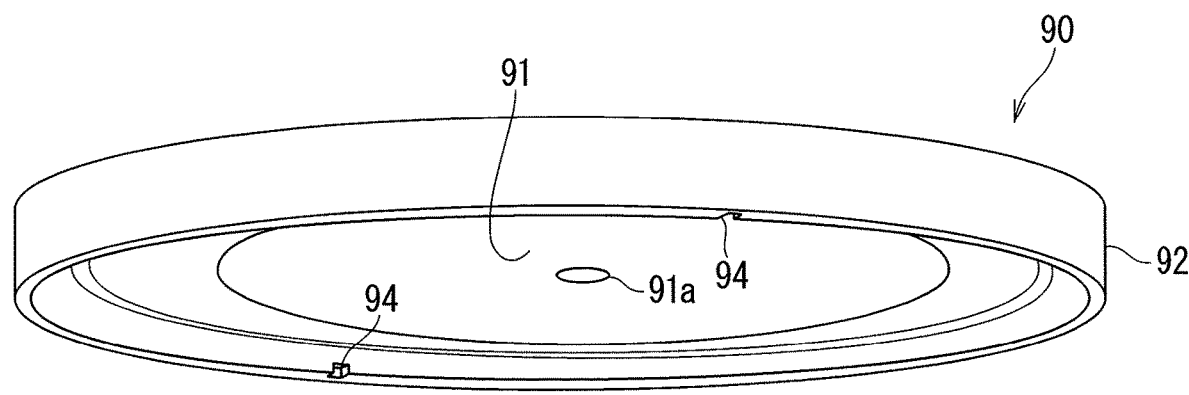
FIG. 4 is a perspective view showing the shielding plate in FIG. 2.
Figure 5:
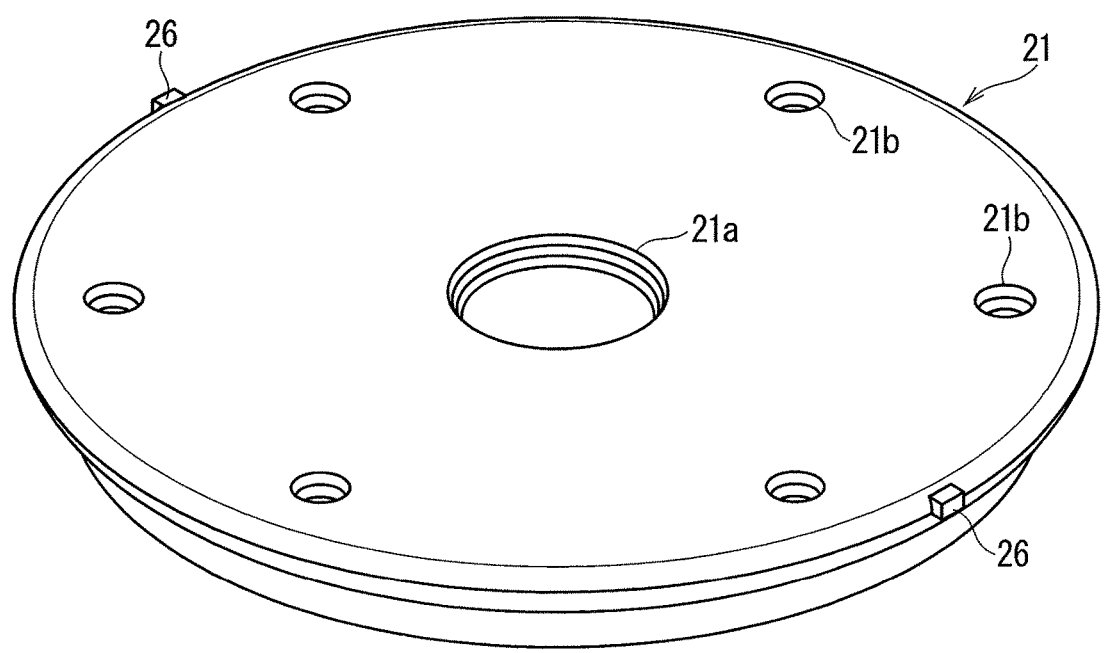
FIG. 5 is a perspective view showing the spin base in FIG. 2.

A structure of a substrate processing device 1 will be described with reference to FIGS. 1 to 5. FIG. 1 is a schematic view for explaining the structure of the substrate processing device 1. In FIG. 1, there is shown a state in which a shielding plate 90 is disposed in a retreat position. Moreover, the shielding plate 90 disposed in a processing position is shown in a virtual line. FIG. 2 is a schematic perspective view showing the shielding plate 90 and a spin base 21 which are rotated around a rotation axis a1 in a state in which the shielding plate 90 is disposed in the processing position. FIG. 3 is a schematic perspective view showing the spin base 21 to be rotated around the rotation axis a1 with a substrate 9 held as seen obliquely from above. Description of the shielding plate 90 is omitted. A surface of the substrate 9 takes an substantially circular shape. The substrate 9 is delivered into/out of the substrate processing device 1 by means of a robot or the like in the state in which the shielding plate 90 is disposed in the retreat position. The substrate 9 delivered into the substrate processing device 1 is held removably by the spin base 21. FIG. 4 is a schematic perspective view showing the shielding plate 90 as seen obliquely from below. FIG. 5 is a schematic perspective view showing the spin base 21 as seen obliquely from above.

Note that in the following description, a "processing solution" includes a "chemical solution" to be used in a chemical solution treatment and a "rinse liquid (which is also referred to as a "cleaning liquid")" to be used for a rinse processing for rinsing the chemical solution.

The substrate processing device 1 includes a spin chuck 2, a scatter preventing portion 3, a surface protecting portion 4, a processing portion 5 and a controller 130. These portions 2 to 5 are electrically connected to the controller 130 and are operated in response to an instruction given from the controller 130. As the controller 130, for example, it is possible to employ the same portion as a general computer. In other words, the controller 130 includes, for example, a CPU for performing various pieces of calculation processing, an ROM to be a read only memory for storing a basic program, an RAM to be a readable/writable memory for storing various information, and a magnetic disk for storing control software, data, and the like. In the controller 130, the CPU to be a main controller performs a calculation processing in accordance with a procedure described in a program, thereby controlling each portion of the substrate processing device 1.

<Spin Chuck 2>

The spin chuck 2 is a substrate holding portion for holding the substrate 9 in an substantially horizontal posture with one of major surfaces thereof turned upward, and rotates the substrate 9 around the perpendicular rotation axis a1 passing through a center c1 of the major surface.

The spin chuck 2 includes a spin base (a "holding member") 21 to be a disk-shaped member which is slightly larger than the substrate 9. The spin base 21 has a cylindrical through hole 21a opened on centers of upper and lower surfaces thereof, respectively. The through hole 21a is formed in such a manner that a central axis thereof is coincident with the rotation axis a1. A cylindrical rotating shaft portion 22 is coupled to the opening on the lower side of the through hole 21a. Consequently, the through hole 21a and a hollow part of the rotating shaft portion 22 communicate with each other. The rotating shaft portion 22 is disposed in such a posture that an axis thereof is set along the perpendicular direction. Moreover, a rotational drive (for example, a motor) 23 is connected to the rotating shaft portion 22. The rotational drive 23 rotatively drives the rotating shaft portion 22 around the axis thereof. The axis of the rotating shaft portion 22 is coincident with the rotation axis a1. Accordingly, the spin base 21 can be rotated around the rotation axis a1 together with the rotating shaft portion 22. The rotating shaft portion 22 and the rotational drive 23 are housed in a cylindrical casing 24.

Moreover, a plurality of (for example, six) chuck pins 25 is provided at a proper interval in the vicinity of a peripheral edge part of the upper surface of the spin base 21. Each of the chuck pins 25 is attached to the spin base 21 through a plurality of openings 21b provided on the upper surface of the spin base 21. The chuck pin 25 abuts on an end face of the substrate 9 to perform positioning for the substrate 9 in a horizontal direction, and furthermore, holds the substrate 9 in an substantially horizontal posture in a slightly higher position than the upper surface of the spin base 21 (that is, at a determined interval from the upper surface of the spin base 21). In other words, the spin base 21 holds the substrate 9 substantially horizontally from below through the chuck pin 25. The upper surface of the spin base 21 is opposed in substantially parallel from the lower surface of the substrate 9 with a clearance, for example. Two protrusions 26 are provided on cylindrical side surface parts of the spin base 21 at a regular interval in a circumferential direction. It is sufficient that at least one protrusion 26 is provided, and a large number of protrusions 26 may be provided.

With this structure, when the rotational drive 23 rotates the rotating shaft portion 22 in a state in which the spin base 21 holds the substrate 9 by the chuck pin 25 thereabove, the spin base 21 is rotated around an axial center in the perpendicular direction. Consequently, the substrate 9 held by the spin base 21 is rotated around the perpendicular rotation axis a1 passing through the center c1 in a plane thereof. The surface protecting portion 4 which will be described below is provided with the shielding plate 90 so as to be rotatable in the circumferential direction around the rotation axis a1. Relative positions of the spin base 21 and the shielding plate 90 in the circumferential direction can be restricted. When the rotational drive 23 rotates the rotating shaft portion 22 in a state in which the relative position is restricted, the spin base 21, the substrate 9 and the shielding plate 90 are rotated in the same rotating direction at an equal rotating speed. The rotational drive 23, the protrusion 26 and a restricting structure 94 constitute a rotating mechanism 231 for rotating the spin base 21 and the shielding plate 90 together in the same direction around the rotation axis a1.

Note that another rotational drive for rotating the shielding plate 90 with the rotation axis a1 with the relative position restricted may be provided in place of the rotational drive 23. In this case, another rotational drive serves as one of components of the rotating mechanism 231 in place of the rotational drive 23. Moreover, both the rotational drive 23 and another rotational drive may be provided. In other words, the rotating mechanism 231 rotates at least one of the spin base 21 and the shielding plate 90 around the rotation axis a1 in the state in which the relative positions of the spin base 21 and the shielding plate 90 in the circumferential direction are restricted. If the rotating mechanism 231 rotates the spin base 21 and the shielding plate 90 in the same direction at the same speed, an air flow turning toward the center c1 side of the substrate 9 can be prevented from being generated between the upper surface of the substrate 9 and the lower surface of the shielding plate 90. Consequently, it is possible to prevent a droplet of a processing solution from being sucked into the upper surface of the substrate 9.

In the case in which both the rotational drive 23 and another rotational drive are provided, the restricting structure 94 and the protrusion 26 may not be provided. In this case, furthermore, a speed for rotating the spin base 21 by the rotational drive 23 may be different from a speed for rotating the shielding plate 90 in the same direction as the spin base 21 by another rotational drive. In the case in which both the rotational drive 23 and another rotating mechanism are provided, moreover, a tip of an extended portion 92 may be positioned on a slightly upper side from the upper surface of the spin base 21.

The chuck pin 25 and the rotational drive 23 are electrically connected to the controller 130 and are operated under control of the controller 130. In other words, a timing for holding the substrate 9 on the spin base 21, a timing for releasing the held substrate 9 and a rotating mode of the spin base 21 (specifically, a rotating start timing, a rotating end timing, the number of rotations (that is, a rotating speed) or the like) are controlled by the controller 130.

<Scatter Preventing Portion 3>

The scatter preventing portion 3 catches a processing solution scattered from the substrate 9 rotated together with the spin base 21 or the like.

The scatter preventing portion 3 includes a splash guard 31. The splash guard 31 is a cylindrical member having an upper end opened and is provided to surround the spin chuck 2. In the present preferred embodiment, the splash guard 31 includes three members of a bottom member 311, an inner member (which will also simply be referred to as an "inside guard" or a "guard") 312, and an outer member (which will also be referred to as an "outside guard") 313, for example. The outer member 313 may not be provided. On the contrary, a guard may further be provided on the outside of the outer member 313 so as to surround the spin chuck 2.

The bottom member 311 is a cylindrical member having an upper end opened and includes an annular bottom portion, a cylindrical inside wall portion extended upward from an inside edge part of the bottom portion, and a cylindrical outside wall portion extended upward from an outside edge part of the bottom portion. At least the vicinity of a tip of the inside wall portion is housed in an inside space of a flange-shaped member 241 provided in a casing 24 of the spin chuck 2.

A solution discharging groove (not shown) communicating with a space between the inside wall portion and the outside wall portion is formed on the bottom portion. The solution discharging groove is connected to a solution discharging line in a factory. Moreover, an air/solution discharging mechanism for forcibly discharging air from an inner part of the groove and bringing the space between the inside wall portion and the outside wall portion into a negative pressure state is connected to the solution discharging groove. The space between the inside wall portion and the outside wall portion is a space for collecting a processing solution used for processing the substrate 9 and discharging the solution, and the processing solution collected into the space is discharged from the solution discharging groove.

The inner member 312 is a cylindrical member having an upper end opened and an upper part (an "upper end side part" or an "upper end part") of the inner member 312 is extended inward and upward. In other words, the upper part is extended obliquely upward toward the rotation axis a1. A cylindrical inner peripheral wall portion extended downward along an inner peripheral surface of the upper part and a cylindrical outer peripheral wall portion extended downward along an outer peripheral surface of the upper part are formed in a lower part of the inner member 312. In a state in which the bottom member 311 and the inner member 312 are close to each other (a state shown in FIG. 1), the outside wall portion of the bottom member 311 is housed between the inner peripheral wall portion and the outer peripheral wall portion of the inner member 312. A processing solution or the like received by the upper part of the inner member 312 is discharged through the bottom member 311.

The outer member 313 is a cylindrical member having an upper end opened and is provided on the outside of the inner member 312. An upper part (an "upper end side part" or an "upper end part") of the outer member 313 is extended inward and upward. In other words, the upper part is extended obliquely upward toward the rotation axis a1. The lower part is extended downward along the outer peripheral wall portion of the inner member 312. A processing solution or the like received by the upper part of the outer member 313 is discharged from a clearance between the outer peripheral wall portion of the inner member 312 and the lower part of the outer member 313.

The splash guard 31 is provided with a guard driving mechanism (an "elevation drive") 32 for moving the splash guard 31 upward and downward. The guard driving mechanism 32 includes a stepping motor, for example. In the present preferred embodiment, the guard driving mechanism 32 independently moves the three members 311, 312 and 313 provided in the splash guard 31 upward and downward.

Each of the inner member 312 and the outer member 313 is moved between an upper position and a lower position thereof upon receipt of driving of the guard driving mechanism 32. Here, the upper positions of the respective members 312 and 313 are positions in which upper edge parts of the members 312 and 313 are disposed on the side of the substrate 9 held by the spin base 21 and thereabove. On the other hand, the lower positions of the respective members 312 and 313 are positions in which the upper edge parts of the members 312 and 313 are disposed below the upper surface of the spin base 21. The upper position (the lower position) of the outer member 313 is placed slightly above the upper position (the lower position) of the inner member 312. The inner member 312 and the outer member 313 are simultaneously or sequentially moved upward and downward so as not to collide with each other. The bottom member 311 is driven by the guard driving mechanism 32 between a position in which the inside wall portion thereof is housed in the inside space of the flange-shaped member 241 provided on the casing 24 and a position placed therebelow. However, the guard driving mechanism 32 is electrically connected to the controller 130 and is operated under control of the controller 130. In other words, the position of the splash guard 31 (specifically, the position of each of the bottom member 311, the inner member 312 and the outer member 313) is controlled by the controller 130.

<Surface Protecting Portion 4>

The surface protecting portion 4 supplies a gas (a cover gas) to the vicinity of the center of the upper surface of the substrate 9 held by the spin base 21, thereby protecting the upper surface of the substrate 9 from an atmosphere of a processing solution supplied to the lower surface or the like.

The surface protecting portion 4 includes a cylindrical cover gas nozzle 41 for discharging a gas toward the vicinity of the center of the upper surface of the substrate 9 held by the spin base 21. The cover gas nozzle 41 is attached to a portion close to a tip of an arm 42 extended horizontally and penetrates the arm 42 in a perpendicular direction. A central axis of the cover gas nozzle 41 is coincident with the rotation axis a1. A lower end part of the cover gas nozzle 41 is extended further downward from a lower end face of the arm 42. A disk-shaped rotating portion 93 is attached to the lower end part of the cover gas nozzle 41 through a bearing. A central axis of the rotating portion 93 is coincident with the rotation axis a1. Consequently, the rotating portion 93 can be rotated in a circumferential direction around the cover gas nozzle 41 around the rotation axis a1.

The disk-shaped shielding plate (an "opposed member") 90 is attached to a lower part of the rotating portion 93 so as to be rotatable together with the rotating portion 93. The upper surface of the shielding plate 90 is provided substantially horizontally and a shape thereof is a circular shape which is slightly larger than the spin base 21, and the rotation axis a1 passes through a center thereof. Consequently, the shielding plate 90 is rotatable in the circumferential direction around the rotation axis a1. The shielding plate 90 includes a disk-shaped body portion 91 with the rotation axis a1 set to be a central axis and the extended portion 92 provided in a peripheral edge part of the body portion 91. A through hole 91a communicating with the cover gas nozzle 41 is provided on a central part of the body portion 91. The extended portion 92 is a cylindrical wall portion (an annular wall portion) extended downward from the peripheral edge part of the body portion 91 and is provided in a circumferential direction of the peripheral edge part. The extended portion 92 is a cylindrical member extending from the peripheral edge part of the body portion 91 toward the spin base 21 side and surrounding the end face of the substrate 9. The extended portion 92 crosses a plane including the substrate 9 at the outside of the end face of the substrate 9 and is thus protruded from the substrate 9 toward the spin base 21 side.

A base end of the arm 42 is coupled to a nozzle base 43. The nozzle base 43 is disposed in such a posture as to set an axis thereof along a perpendicular direction and is configured to be extendable in the perpendicular direction. A base end of the arm 42 is coupled to an upper end of the nozzle base 43. The nozzle base 43 is provided with a driving portion (a "moving portion") 44 for expanding/contracting the nozzle base 43 along the axis thereof. The driving portion 44 includes a stepping motor and the like, for example.

The driving portion 44 expands/contracts the nozzle base 43, thereby moving the shielding plate 90 relatively with respect to the spin base 21 in a direction of the rotation axis a1 between a processing position (a "first position") and a retreat position (a "second position") above the processing position. The processing position of the shielding plate 90 is a position placed above the substrate 9 held by the spin base 21 and is a position in which the lower surface of the shielding plate 90 is opposed to the upper surface of the substrate 9, and at the same time, approaches the upper surface in a non-contact state. The retreat position of the shielding plate 90 is a position in which the shielding plate 90 does not interfere with a delivery path of the substrate 9 and, for example, a position placed above the upper edge part of the splash guard 31. When the shielding plate 90 is disposed in the processing position, the body portion 91 is opposed to the upper surface of the substrate 9 held by the spin base 21 with a clearance formed therebetween, for example, substantially in parallel. The driving portion 44 is electrically connected to the controller 130 and is operated under the control of the controller 130. In other words, the position of the shielding plate 90 is controlled by the controller 130.

Two restricting structures 94 are provided in the tip side part of the extended portion 92. A recess opened from the tip surface of the extended portion 92 to the inner peripheral surface of the extended portion 92 is employed as the restricting structure 94 as shown in FIG. 4, for example. At least a part of the protrusion 26 is housed in the recess.

Respective initial positions (initial rotating angles) in circumferential direction are preset to the spin base 21 and the shielding plate 90. When the shielding plate 90 is disposed in the retreat position placed above the processing position, the spin base 21 and the shielding plate 90 are disposed in the respective initial positions in the circumferential direction. The two restricting structures 94 are provided in the tip side parts of the extended portion 92 respectively in such a manner that two protrusions 26 provided on the side surface part of the spin base 21 overlap with each other as seen through from above the shielding plate 90 in this state.

Figure 6:
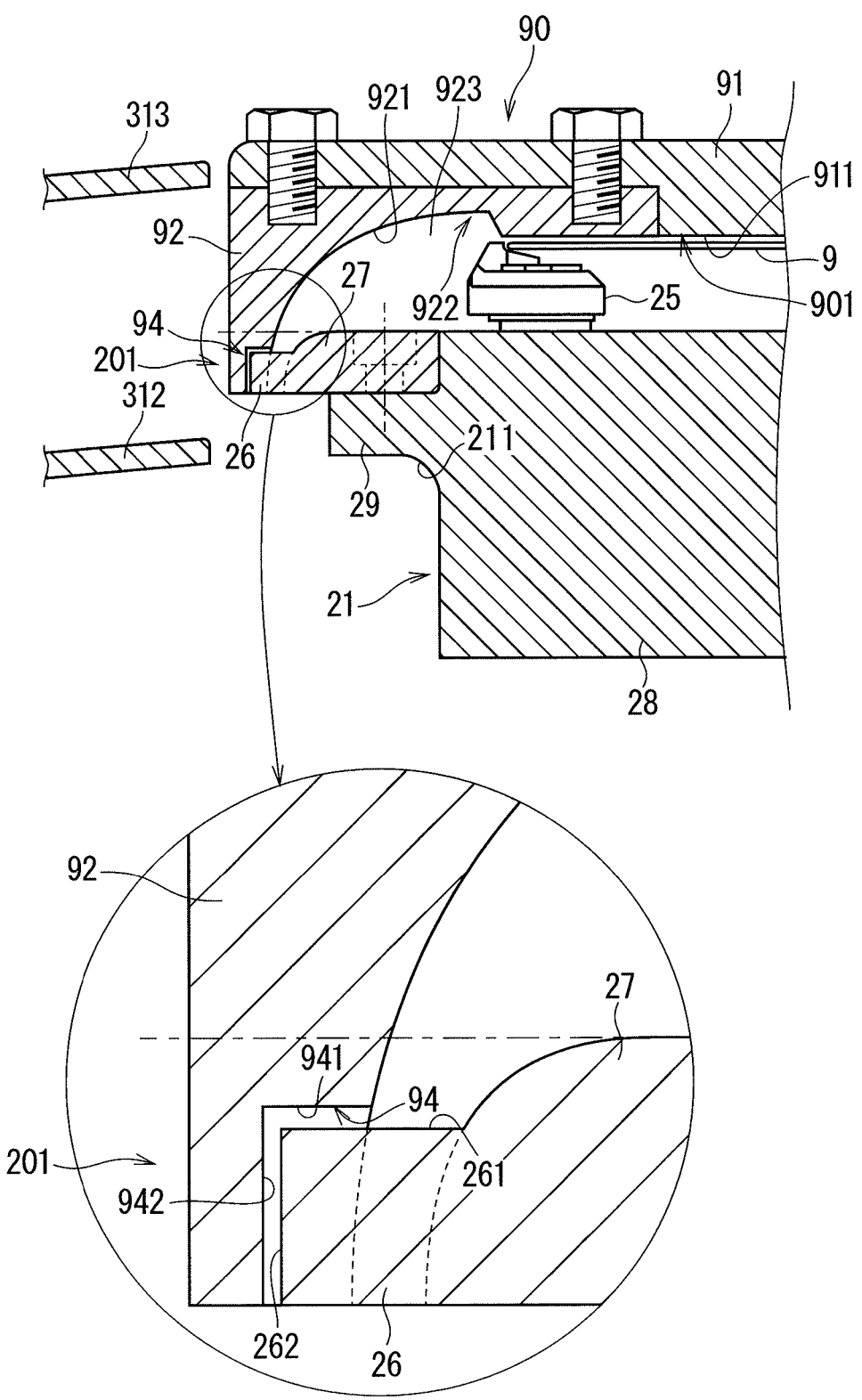
FIG. 6 is a longitudinal sectional view showing peripheral edge parts of the shielding plate and the spin base in FIG. 2.

In a state in which the shielding plate 90 is disposed in the processing position as shown in FIG. 6, at least a part of the protrusion 26 is housed in the restricting structure 94. In this case, the restricting structure 94 is disposed opposite to the protrusion 26 from ahead of and behind the protrusion 26 in the circumferential direction around the rotation axis a1 to restrict relative motion in the circumferential direction of the protrusion 26. In the state in which the shielding plate 90 is disposed in the processing position, moreover, the extended portion 92 extends from the peripheral edge part of the body portion 91 toward the side of the spin base 21. Then, the restricting structure 94 is disposed below the upper surface of the spin base 21. In other words, both the protrusion 26 and the restricting structure 94 are disposed below the upper surface of the spin base 21. The spin base 21 and the shielding plate 90 mutually restrict the relative motion therebetween in the circumferential direction around the rotation axis a1 through the protrusion 26 and the restricting structure 94. In other words, the restricting structure 94 and the protrusion 26 form a restricting portion 201 for restricting the relative motion in the circumferential direction between the spin base 21 and the shielding plate 90. In other words, the restricting portion 201 restricts a relative position of the shielding plate 90 with respect to the spin base 21 in the circumferential direction around the rotation axis a1.

When the shielding plate 90 is disposed in the retreat position, respective rotational positions of the restricting structure 94 and the protrusion 26 in the circumferential direction around the rotation axis a1 are aligned with each other. The restricting structure 94 is disposed to keep away from a relative movement path of the protrusion 26 with respect to the restricting structure 94 in a moving process of the shielding plate 90 from the retreat position to the processing position. Consequently, it is possible to avoid a collision of the restricting structure 94 and the protrusion 26 in the moving process. When the shielding plate 90 is disposed in the processing position, the restricting structure 94 is disposed opposite to the protrusion 26 from ahead of and behind the protrusion 26 in the circumferential direction around the rotation axis a1. In more detail, when the spin base 21 is stopped immediately after the restricting structure 94 is disposed in the processing position, the restricting structure 94 is placed opposite to the protrusion 26 without coming in contact with the protrusion 26 from ahead of and behind the protrusion 26 in the circumferential direction. Consequently, the relative position of the shielding plate 90 with respect to the spin base 21 is restricted in the circumferential direction. When the shielding plate 90 is disposed in the retreat position, moreover, the restricting structure 94 is placed relatively apart from the protrusion 26 in the direction of the rotation axis a1.

In a state in which the shielding plate 90 is disposed in the processing position and the relative position in the circumferential direction of the shielding plate 90 with respect to the spin base 21 is restricted by the restricting portion 201, when the rotational drive 23 rotates the rotating shaft portion 22, the spin base 21 is rotated together with the substrate 9. Consequently, the protrusion 26 abuts on a portion of the restricting structure 94 at a downstream side in the rotating direction with respect to the protrusion 26. Then, the shielding plate 90 is driven and rotated at an equal rotating speed in the same rotating direction as the spin base 21.

Here, there will be considered the case in which an emergency stop operation is performed during a processing while the substrate processing device 1 rotates the substrate, for example. For example, in this case, it is assumed that the substrate processing device 1 moves the shielding plate 90 to the retreat position. Also in the case in which the shielding plate 90 and the spin base 21 are not placed in the initial positions (the initial rotating angles), thus, it is necessary to automatically restart the processing.

The spin base 21 is driven by the rotational drive 23 and can be thus rotated, while the shielding plate 90 is driven and rotated by the rotation of the spin base 21. For this reason, the following operation is required. The controller 130 controls the driving portion 44 to move the shielding plate 90 in a vertical direction in such a manner that the shielding plate 90 slightly comes in contact with the spin base 21, for example. Thereafter, the controller 130 controls the rotational drive 23 to rotate the spin base 21 at a low speed, thereby rotating the shielding plate 90 in the circumferential direction around the rotation axis a1.

The shielding plate 90 includes a sensor capable of detecting the initial position of the shielding plate 90 in the circumferential direction. The controller 130 controls the rotational drive 23 to stop the rotation of the shielding plate 90 when the shielding plate 90 reaches the initial position based on an output of the sensor.

Then, the controller 130 controls the driving portion 44 to move the shielding plate 90 to the retreat position thereabove, and furthermore, controls the rotational drive 23 to rotate the spin base 21 in the initial position in the circumferential direction. In the state in which the shielding plate 90 is disposed in the retreat position, consequently, the shielding plate 90 and the spin base 21 are disposed in the initial positions in the circumferential direction. It is preferable that the shielding plate 90 not be shifted from the initial position in the circumferential direction when the shielding plate 90 is moved relatively with respect to the spin base 21 between the retreat position and the processing position. For this reason, the surface protecting portion 4 preferably includes a lock mechanism for fixing the positions in the circumferential direction of the rotating portion 93 and the shielding plate 90 with respect to the arm 42 in the state in which the shielding plate 90 is disposed in the initial position in the circumferential direction. When the shielding plate 90 is disposed in the processing position, the lock mechanism is released.

Although the restricting structure 94 is provided on the tip side part (the lower end side part) of the extended portion 92 and the protrusion 26 is provided on the side surface part of the spin base 21 in the examples of FIGS. 4 and 5, the restricting structure 94 may be provided on the side surface portion of the spin base 21 and the protrusion 26 may be provided on the tip side part of the extended portion 92. In other words, the protrusion 26 is provided in one part of the tip side part of the extended portion 92 of the shielding plate 90 and the side surface part of the spin base 21, and furthermore, the restricting structure 94 is provided in the other part.

A pair of protrusions disposed opposite to the protrusion 26 from ahead of and behind the protrusion 26 in the circumferential direction around the rotation axis a1 may be employed as the restricting structure 94 in place of the recess, for example. Also in this case, the relative motion in the circumferential direction of the protrusion 26 can be restricted by the restricting structure. Therefore, usefulness of the present invention is not damaged. In the case in which the recess capable of housing at least a part of the protrusion 26 is employed as the restricting structure as shown in FIG. 4, an interval between the spin base 21 and the extended portion 92 of the shielding plate 90 can be reduced more greatly. For this reason, a diameter of the shielding plate 90 can be reduced more greatly.

Although the extended portion 92 shown in FIG. 4 is a cylindrical member, moreover, it is also possible to use, as the extended portion, a plurality of wall portions or column portions distributed and disposed in the circumferential direction in the peripheral edge part of the body portion 91 and extended downward from the peripheral edge part. The extended portion extends from at least a part of the peripheral edge part of the body portion 91 toward the side of the spin base 21. If the extended portion is the cylindrical member, it does not cross the flow of the processing solution supplied to the substrate 9 and discharged from the substrate 9 to the outside. For this reason, it is possible to lessen the processing solution splashed back from the extended portion toward the substrate 9 side.

A cover gas supplying portion 45 to be a piping system for supplying a gas (here, a nitrogen ($N_2$) gas, for example) to the cover gas nozzle 41 is connected thereto. Specifically, the cover gas supplying portion 45 includes a structure in which a nitrogen gas supply source 451 to be a supply source for supplying the nitrogen gas is connected to the cover gas nozzle 41 through a pipe 452 having a switching valve 453 inserted therebetween, for example. With this structure, when the switching valve 453 is opened, the nitrogen gas supplied from the nitrogen gas supply source 451 is discharged from the through hole 91*a* provided on the central part of the shielding plate 90 via the cover gas nozzle 41. Note that the gas supplied to the cover gas nozzle 41 may be a gas other than the nitrogen gas (for example, various inert gases, dry air and the like other than the nitrogen gas).

When the gas is supplied from the cover gas supplying portion 45 to the cover gas nozzle 41 in the state in which the shielding plate 90 is disposed in the processing position, the gas (cover gas) is discharged from the cover gas nozzle 41 to the upper surface of the substrate 9 toward the vicinity of the center of the upper surface of the substrate 9 held by the spin base 21. However, the switching valve 453 of the cover gas supplying portion 45 is electrically connected to the controller 130 and is opened/closed under the control of the controller 130. In other words, a discharging mode of the gas from the cover gas nozzle 41 (specifically, a discharging start timing, a discharging end timing, a discharging flow rate or the like) is controlled by the controller 130.

<Processing Portion 5>

The processing portion 5 performs a processing for a to-be-processed surface (a lower surface in the example of FIG. 1) of the substrate 9 held by the spin base 21. Specifically, the processing portion 5 supplies a processing solution to the to-be-processed surface of the substrate 9 held by the spin base 21.

As shown in FIG. 1, the processing portion 5 includes a supply pipe 81 disposed in penetration through the hollow part of the rotating shaft portion 22 of the spin chuck 2, for example. A tip of the supply pipe 81 is connected to the opening on the lower side of the through hole 21*a* in such a manner that the supply pipe 81 and the through hole 21*a* of the spin base 21 communicate with each other. A nozzle 50 is connected to the opening on the upper side (the substrate 9 side) of the through hole 21*a*. The nozzle 50 includes a discharging port facing the lower surface of the substrate 9 which is held by the spin base 21 and is being rotated. The nozzle 50 discharges the processing solution supplied via the supply pipe 81 from the discharging port to the lower surface of the substrate 9. Note that it is also possible to employ a nozzle capable of supplying the processing solution to the upper surface (a whole part or a peripheral edge part) of the substrate 9 which is the to-be-processed surface. Such a nozzle is provided on the shielding plate 90, for example. In other words, the substrate processing device 1 includes a nozzle capable of discharging the processing solution to the to-be-processed surface of any one of the upper and lower surfaces of the substrate 9 which is held by the spin base 21 and is being rotated. Various nozzles capable of discharging the processing solution to the to-be-processed surface of the substrate 9 can be employed as the nozzle 50.

A processing solution supplying portion 83 to be a piping system for supplying the processing solution to the supply pipe 81 is connected thereto. Specifically, the processing solution supplying portion 83 is configured in combination of an SC-1 supply source 831*a*, a DHF supply source 831*b*, an SC-2 supply source 831*c*, a rinse liquid supply source 831*d*, a plurality of pipes 832*a*, 832*b*, 832*c* and 832*d*, and a plurality of switching valves 833*a*, 833*b*, 833*c* and 833*d*.

The SC-1 supply source 831*a* is a supply source for supplying SC-1. The SC-1 supply source 831*a* is connected to the supply pipe 81 through the pipe 832*a* having the switching valve 833*a* inserted therebetween. When the switching valve 833*a* is opened, accordingly, the SC-1 supplied from the SC-1 supply source 831*a* is discharged from the nozzle 50.

The DHF supply source 831*b* is a supply source for supplying DHF. The DHF supply source 831*b* is connected to the supply pipe 81 through the pipe 832*b* having the switching valve 833*b* inserted therebetween. When the switching valve 833*b* is opened, accordingly, the DHF supplied from the DHF supply source 831*b* is discharged from the nozzle 50.

The SC-2 supply source 831*c* is a supply source for supplying SC-2. The SC-2 supply source 831*c* is connected to the supply pipe 81 through the pipe 832*c* having the switching valve 833*c* inserted therebetween. When the switching valve 833*c* is opened, accordingly, the SC-2 supplied from the SC-2 supply source 831*c* is discharged from the nozzle 50.

The rinse liquid supply source 831*d* is a supply source for supplying a rinse liquid. Here, the rinse liquid supply source 831*d* supplies pure water as the rinse liquid, for example. The rinse liquid supply source 831*d* is connected to the supply pipe 81 through the pipe 832*d* having the switching valve 833*d* inserted therebetween. When the switching valve 833*d* is opened, accordingly, the rinse liquid supplied from the rinse liquid supply source 831*d* is discharged from the nozzle 50. Note that as the rinse liquid, it is also possible to use pure water, warm water, ozone water, magnetic water, reduced water (hydrogen water), various organic solvents (ion water, IPA (isopropyl alcohol), function water ($CO_2$ water, etc.) or the like.

When the processing solution (SC-1, DHF, SC-2 or the rinse liquid) is supplied from the processing solution supplying portion 83 to the supply pipe 81, the processing solution is discharged from the nozzle 50 toward the vicinity of the center of the to-be-processed surface of the substrate 9 held by the spin base 21. However, each of the switching valves 833*a*, 833*b*, 833*c* and 833*d* provided in the processing solution supplying portion 83 is electrically connected to the controller 130 and is opened/closed under the control of the controller 130. In other words, a discharging mode of the processing solution from the nozzle 50 (specifically, a type of the processing solution to be discharged, a discharging start timing, a discharging end timing, a discharging flow rate or the like) is controlled by the controller 130. The nozzle 50, the supply pipe 81 and the processing solution supplying portion 83 form a processing solution discharging portion 83A for discharging the processing solution to the to-be-processed surface of the substrate 9 under the control of the controller 130.

<1-2. Structure of Shielding Plate and Spin Base>

Figure 8:
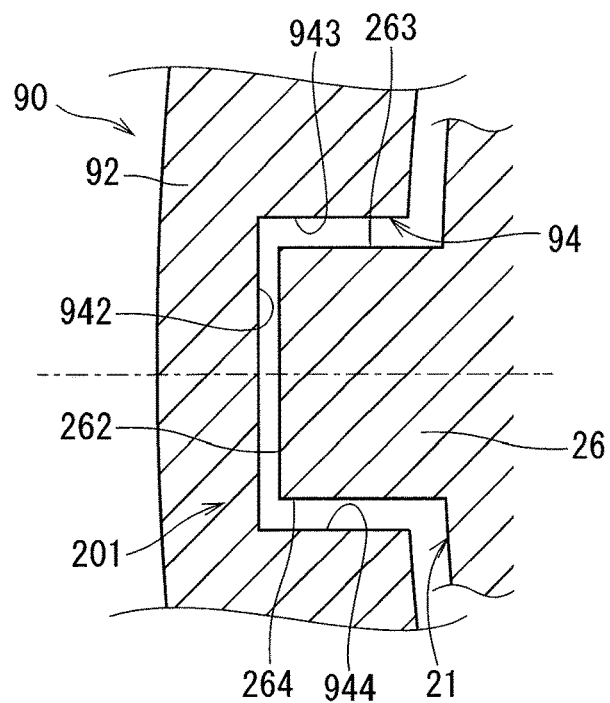
FIG. 8 is a cross sectional view showing a restricting portion in FIG. 6.
Figure 9:
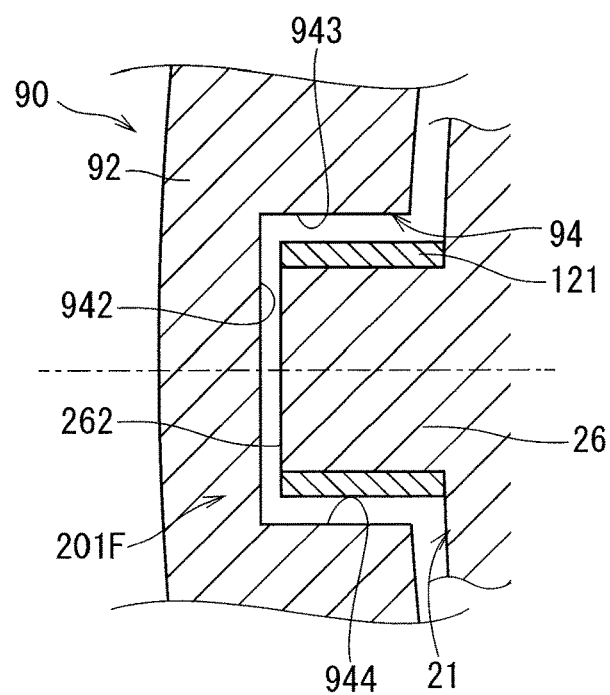
FIG. 9 is a sectional view showing a state in which the restricting portion in FIG. 8 is covered with an elastic member.

FIGS. 6 and 7 are longitudinal sectional views showing structures of the shielding plate 90 and the peripheral edge part of the spin base 21 in the case in which the shielding plate 90 is disposed in the processing position. FIG. 6 shows a section in the restricting portion 201 and FIG. 7 shows a section in a portion other than the restricting portion 201. In examples of FIGS. 6 and 7, the splash guard 31 has the outer member 313 disposed in an upper position and the inner member 312 disposed in a lower position. FIG. 8 is a cross sectional view showing the restricting portion 201. FIG. 9 is a cross sectional view showing another restricting portion 201F according to the first preferred embodiment.

The spin base 21 includes the disk-shaped base 28 taking a circular upper surface shape and the annular flange portion 29 protruded outward in a radial direction from a slightly lower position than the upper surface of the base 28 in a peripheral edge (a side surface) of the base 28. The base 28 and the flange portion 29 are integrally formed of vinyl chloride, for example. The upper surface and the lower surface (in more detail, a lower surface of a portion other than the base end part in the flange portion 29, that is, a lower surface of the tip side part of the flange portion 29) of the flange portion 29 are formed along a horizontal surface and the side surface of the base 28 is a perpendicular surface. An annular curved surface ("a curved surface portion") 211 in the circumferential direction of the spin base 21 is formed in the base end part of the flange portion 29. The curved surface 211 takes a sectional shape of a ¼ circular arc which is obliquely and upward convex toward the rotation axis a1, for example. A radius of the circular arc is set to be 5 mm to 10 mm, for example. The lower surface of the tip side part of the flange portion 29 and a lower side part of the flange portion 29 in the side surface of the base 28 are connected gently through the curved surface 211.

An annular recess is formed by the upper surface of the flange portion 29 and the upper side part of the flange portion 29 in the side surface of the base 28. A draining portion ("an upper flange portion") 27 to be an annular plate-shaped member is fixed to the recess with a bolt. The draining portion 27 is preferably formed of fluororesin or the like which has a higher heat resisting property than the base 28, for example. An outer peripheral edge part of the draining portion 27 extends outward from the outer peripheral edge of the flange portion 29 in the radial direction of the base 28. A diameter of the outer peripheral edge of the draining portion 27, that is, a diameter of the outer peripheral edge of the spin base 21 is larger than a diameter of the substrate 9. An upper surface of a portion other than the outer peripheral edge part ("tip part") in the draining portion 27 forms an identical horizontal plane to the upper surface of the base 28. The upper surface of the outer peripheral edge part of the draining portion 27 is a curved surface which is overhung and convexly curved obliquely upward and outward. The outer peripheral edge part has a thickness reduced gradually closer to the outer peripheral edge. The two protrusions 26 described above are protruded from the tip (outer edge) of the outer peripheral edge part of the draining portion 27 outward in the radial direction of the shielding plate 90, respectively. The protrusion 26 is formed to take a shape of a quadrangular prism as shown in FIGS. 5, 6 and 8, for example. An upper surface 261 of the protrusion 26 is a horizontal plane taking a rectangular shape. A tip surface 262 of the protrusion 26 is a perpendicular plane taking a rectangular shape which is orthogonal to the upper surface 261 and has a normal passing through a center thereof that intersects with the rotation axis a1. Side surfaces 263 and 264 of the protrusion 26 are perpendicular planes taking rectangular shapes which are orthogonal to both the upper surface 261 and the tip surface 262. The upper surface 261 is positioned below the upper surface of the base 28. Consequently, the whole protrusion 26 is positioned below the upper surface of the base 28.

The body portion 91 of the shielding plate 90 is a disk-shaped member formed of vinyl chloride, for example. A lower surface 911 other than the peripheral edge part in the lower surface of the body portion 91 is opposed to the upper surface of the substrate 9 held by the chuck pin 25 of the spin base 21 with a clearance. An interval D2 between the lower surface 911 and the upper surface of the substrate 9 is approximately 1 mm, for example. An annular recess along a peripheral edge is formed on the peripheral edge part of the lower surface of the body portion 91. Consequently, a thickness of the peripheral edge part of the body portion 91 is substantially a half of the other portions. The extended portion 92 takes an annular shape which can be fitted in the recess. The extended portion 92 is fitted in the recess and is thus fixed to the body portion 91 with a bolt. The extended portion 92 is preferably formed of a material such as fluororesin which is more excellent in a heat resisting property than the body portion 91, for example. An annular inner peripheral surface 921 of the extended portion 92 stands upward from a lower end thereof and then extends to a part above the peripheral edge part of the substrate 9 toward the rotation axis a1 side. An annular peripheral edge part on the rotation axis a1 side in the inner peripheral surface 921 is connected gently to the lower surface 911 of the body portion 91 and forms an opposed surface which is opposed to the upper surface of the substrate 9 together with the lower surface 911. The extended portion 92 constitutes a cylindrical wall portion extending downward from the peripheral edge part of the body portion 91, and a tip side part thereof extends to the side part of the spin base 21. A part on the tip side (the lower end side) of the extended portion 92 in the inner peripheral surface 921 of the extended portion 92 extends to the side part of the spin base 21. The inner peripheral surface 921 on the outer edge side of the extended portion 92 is a curved surface which is curved to be overhung obliquely upward and outward with respect to the upper surface of the spin base 21. In other words, the part on the tip side (the lower end side) of the extended portion 92 in the inner peripheral surface 921 is a curved surface which is curved to be overhung obliquely upward and outward with respect to the upper surface of the spin base 21. Consequently, a width of the tip side part of the extended portion 92 in the radial direction of the shielding plate 90 is gradually reduced downward, that is, toward the side part of the spin base 21. Thus, the inner peripheral surface 921 is continuous with the lower surface of the shielding plate 90, and furthermore, is convexly curved to be overhung obliquely upward and outward with respect to the upper surface of the spin base 21.

The restricting structure 94 is formed in the tip side part of the extended portion 92. The restricting structure 94 is a recess opened from the tip surface of the extended portion 92 to the inner peripheral surface of the extended portion 92 as shown in FIGS. 4, 6 and 8, for example. The restricting structure 94 is formed so as to house at least a part of the protrusion 26 therein when the shielding plate 90 is disposed in the processing position. An upper surface 941 of the restricting structure 94 is a horizontal plane taking a rectangular shape. A bottom face 942 of the restricting structure 94 is a perpendicular plane taking a rectangular shape which is orthogonal to the upper surface 941 and has a normal passing through a center thereof that intersects with the rotation axis a1. Side surfaces 943 and 944 of the restricting structure 94 are perpendicular planes taking rectangular shapes which are orthogonal to both the upper surface 941 and the bottom face 942. The upper surface 941 is positioned below the upper surface of the base 28 and above the upper surface 261 of the protrusion 26. Consequently, the whole restricting structure 94 is positioned below the upper surface of the base 28.

When the shielding plate 90 is disposed in the processing position, one of the two restricting structures 94 houses at least a part of one of the two protrusions 26, and the other restricting structure 94 houses at least a part of the other protrusion 26.

In a state brought immediately after the protrusion 26 is housed in the restricting structure 94, when the spin base 21 is stopped, the upper surface 941 of the restricting structure 94 and the upper surface 261 of the protrusion 26 are opposed to each other with a clearance and the bottom face 942 of the restricting structure 94 and the tip surface 262 of the protrusion 26 are opposed to each other with a clearance. Then, the side surface 943 of the restricting structure 94 is opposed to the side surface 263 of the protrusion 26, and the side surface 944 of the restricting structure 94 is opposed to the side surface 264 of the protrusion 26. Consequently, the restricting structure 94 is disposed opposite to the protrusion 26 from ahead of and behind the protrusion 26 in the circumferential direction around the rotation axis a1 so that relative motion of the protrusion 26 in the circumferential direction can be restricted. The restricting structure 94 and the protrusion 26 form the restricting portion 201 for restricting relative motion between the spin base 21 and the shielding plate 90 in the circumferential direction around the rotation axis a1.

As shown in FIG. 7, a clearance G1 is formed in a part other than the restricting portion 201 between the tip side part of the extended portion 92 and the side part of the spin base 21, more specifically, the tip part of the draining portion 27 in the state in which the shielding plate 90 is disposed in the processing position. A width D1 of the clearance G1 is approximately 1 mm to 5 mm, for example. The processing solution discharged to the to-be-processed surface of the substrate 9 by the nozzle 50 of the processing portion 5 is discharged to the outside of the substrate 9 along the to-be-processed surface, and furthermore, is discharged from the peripheral edge part of the spin base 21 to the outside via the clearance G1. If the tip part of the extended portion 92 in the inner peripheral surface 921 of the extended portion 92 and the upper surface of the tip part of the draining portion 27 are curved each other as described above, the processing solution is discharged smoothly from the clearance G1 to the outside.

The upper end part of the inner peripheral surface 921 of the extended portion 92 is placed in a higher position than the opposed surface above an opposed surface which is opposed to the substrate 9 in the lower surface of the shielding plate 90 (in more detail, a peripheral edge part of the opposed surface), that is, with respect to the upper surface of the spin base 21. Consequently, an annular recess 922 is formed on the upper end side part of the inner peripheral surface 921. The recess 922 is formed in the circumferential direction around the rotation axis a1. The recess 922 is formed between the tip side part of the extended portion 92 and the part opposed to the substrate 9 in the shielding plate 90. In other words, the recess 922 is formed in a portion between the tip side part of the extended portion 92 and the opposed part opposed to the substrate 9 in the inside surface 901 of the shielding plate 90. The inside surface 901 is a surface surrounding the upper surface and the end face of the substrate 9. The inside surface 901 includes the lower surface 911 of the body portion 91 and the inner peripheral surface 921 of the extended portion 92. The recess 922 is recessed upward from the peripheral edge part of the opposed portion which is opposed to the upper surface of the substrate 9 in the shielding plate 90. An annular bulged space ("bulged space") 923 is formed between the recess 922 and the upper surface of the spin base 21. The space 923 is bulged upward from the opposed surface which is opposed to the substrate 9 in the shielding plate 90. An interval D3 between the most recessed part of the recess 922 and the upper surface of the substrate 9 is greater than the interval D2. A width D4 of the recess 922 in the radial direction of the shielding plate 90 is preferably set to be equal to or greater than 20 mm, for example.

The curved surface which is convexly curved obliquely upward and outward with respect to the upper surface of the spin base 21 is formed as described above in the portion on the outside of the recess 922 (the outside in the radial direction of the shielding plate 90) with respect to the lower surface 911 in the inside surface 901 of the shielding plate 90 (in more detail, the inner peripheral surface 921 of the extended portion 92). Note that in the shown example, the lower surface 911 is parallel with the upper surface of the substrate 9. However, it is not required that the whole lower surface 911 is parallel with the upper surface of the substrate 9, for example, a part excluding the peripheral edge part of the lower surface 911 gradually becomes higher than the upper surface of the substrate 9 toward the center of the lower surface 911.

In some cases, the processing solution discharged from the clearance G1 stays in the space between the extended portion 92 and the draining portion 27 depending on the amount of the processing solution and the width of the clearance G1. However, the space 923 formed by the recess 922 serves as a buffer. Consequently, it is possible to prevent the processing solution from being splashed back and sticking to the non-processed surface of the substrate 9 due to the staying processed solution.

Moreover, a part of the processing solution discharged from the tip part of the draining portion 27 hits the restricting structure 94 and the protrusion 26 and is thus splashed back. However, both the restricting structure 94 of the shielding plate 90 and the protrusion 26 of the spin base 21 are provided below the upper surface of the spin base 21 in the state in which the shielding plate 90 is disposed in the processing position. Therefore, the processing solution splashed back is prevented from sticking to a major surface ("the non-processed surface") other than the to-be-processed surface of the substrate 9.

If the extended portion 92 and the draining portion 27 are formed of fluororesin or the like having an excellent heat resisting property, the shielding plate 90 and the spin base 21 can be prevented from being damaged by a high temperature even if the processing solution has the high temperature. However, the fluororesin is more excellent in the heat resisting property and has a lower hardness as compared with vinyl chloride, for example. In the case in which the rotational drive 23 rotates the spin base 21 through the rotating shaft portion 22 in the state in which the shielding plate 90 is disposed in the processing position, the protrusion 26 and the restricting structure 94 abut on each other in acceleration and deceleration. Consequently, the restricting structure 94 and the protrusion 26, that is, members formed of the fluororesin collide with each other so that dust is generated in some cases. When the dust sticks to the substrate 9, a defect is caused. Note that the extended portion 92 and the spin base 21 may be formed integrally of the same material, respectively.

In the example of the structure in FIG. 9, in the protrusion 26 of the spin base 21, a surface other than the tip surface 262 in the outer peripheral surface thereof is covered with an O ring or the like which is formed by an elastic member such as EPDM. Even if the restricting structure 94 and the protrusion 26 abut on each other in the acceleration of the spin base 21, the generation of the dust can be suppressed. Note that at least one of the protrusion 26 and the restricting structure 94 can suppress the generation of the dust if a part opposed to the other is covered with the elastic member. Even if neither the protrusion 26 nor the restricting structure 94 is covered with the elastic member, usefulness of the present invention is not damaged.

Figure 12:
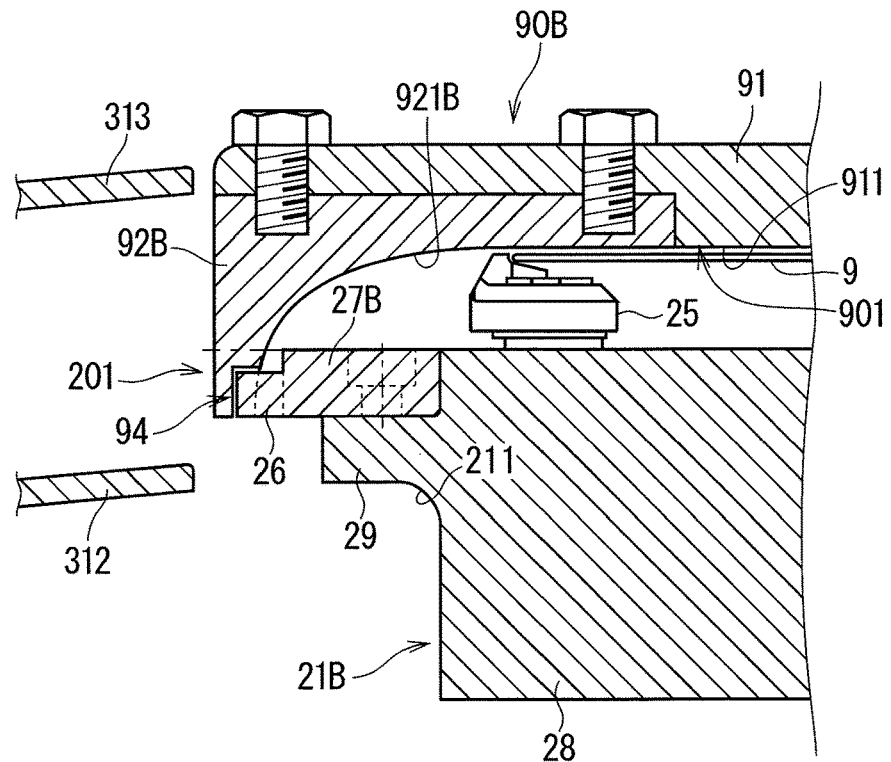
FIG. 12 is a longitudinal sectional view showing another example of the structures of the shielding plate and the spin base according to the first preferred embodiment of the present invention.
Figure 13:
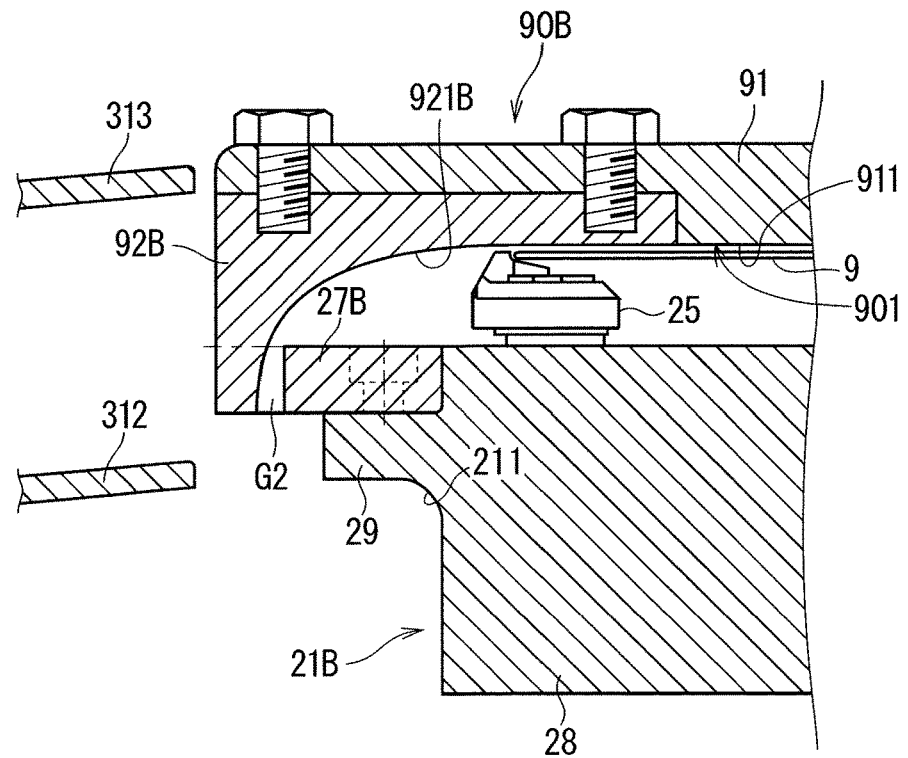
FIG. 13 is a longitudinal sectional view showing other sections of the shielding plate and the spin base in FIG. 12.

FIGS. 12 and 13 are longitudinal sectional views showing a shielding plate 90B and a spin base 21B as another example of structures of the shielding plate and the spin base in the substrate processing device according to the first preferred embodiment. FIGS. 12 and 13 show peripheral edge parts of the shielding plate 90B and the spin base 21B. FIG. 12 shows a section in a restricting portion 201 and FIG. 13 shows a section in a part other than the restricting portion 201. The shielding plate 90B has the same structure as that of the shielding plate 90 except that an extended portion 92B is provided in place of the extended portion 92 of the shielding plate 90. The spin base 21B has the same structure as that of the spin base 21 except that a draining portion 27B is provided in place of the draining portion 27 of the spin base 21.

An inner peripheral surface (a lower surface) 921B of the extended portion 92B is smoothly connected to a lower surface of a part other than the thin peripheral edge part of the body portion 91. The recess 922 of the extended portion 92 is not formed on the inner peripheral surface 921B. Moreover, the curved surface provided on the upper surface of the tip part of the draining portion 27 is not formed on the draining portion 27B and a tip surface of the draining portion 27B is a perpendicular plane. The processing solution is discharged from a clearance G2 between the extended portion 92B and the draining portion 27B to the outside via the to-be-processed surface of the substrate 9 and the peripheral edge part of the upper surface of the spin base 21B. In a part provided with the restricting portion 201, the processing solution is splashed back by the restricting portion 201 (the restricting structure 94, the protrusion 26).

However, the protrusion 26 provided in the tip part of the draining portion 27B, that is, the side surface part of the spin base 21B and the restricting structure 94 provided in the tip side part of the extended portion 92B are disposed below the upper surface of the spin base 21B. Consequently, intrusion and sticking of the processing solution splashed back to the non-processed surface of the substrate 9 can be suppressed. Even if the shielding plate 90B is employed in place of the shielding plate 90, and furthermore, the spin base 21B is employed in place of the spin base 21, accordingly, the usefulness of the present invention is not damaged. Moreover, the shielding plate 90B may be combined with the spin base 21 and the shielding plate 90 may be combined with the spin base 21B.

<1-3. Referring to Another Example of Structure>

Figure 10:
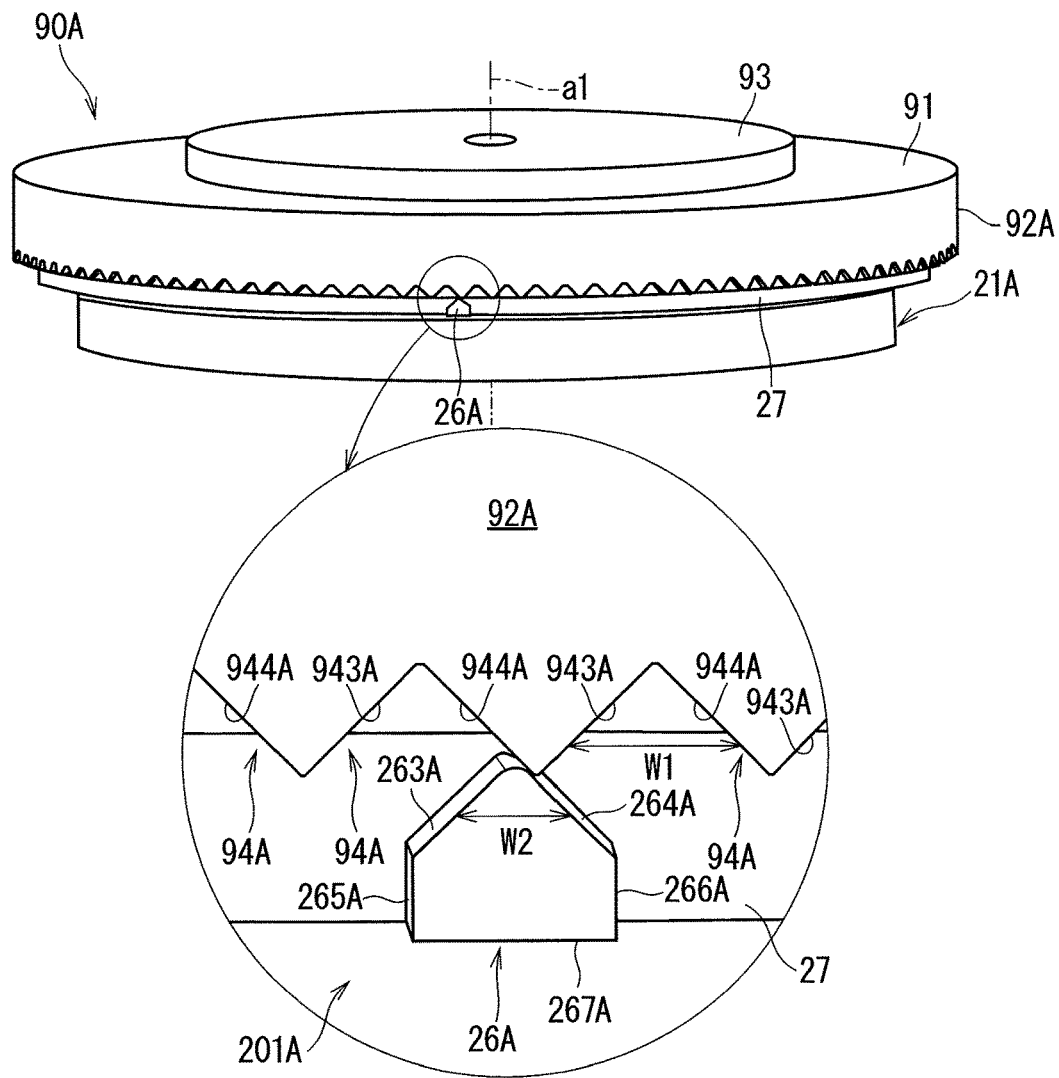
FIG. 10 is a perspective view showing another example of the structures of the shielding plate and the spin base according to the first preferred embodiment of the present invention.
Figure 11:
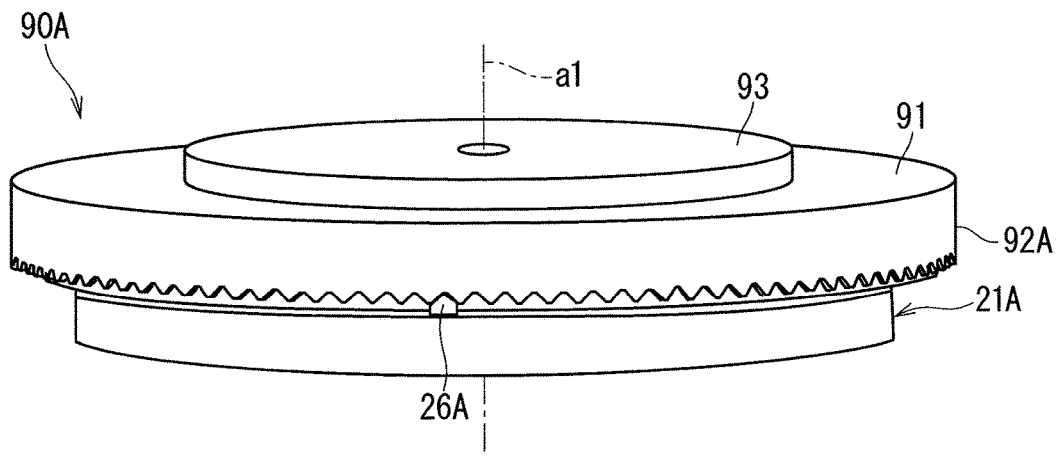
FIG. 11 is a perspective view showing a state in which the shielding plate in FIG. 10 is disposed in a processing position.

FIGS. 10 and 11 are perspective views showing a shielding plate 90A and a spin base 21A as another example of the structures of the shielding plate and the spin base in the substrate processing device according to the first preferred embodiment. FIG. 11 is a perspective view showing the shielding plate 90A and the spin base 21A in the case in which the shielding plate 90A is disposed in a processing position.

The shielding plate 90A has the same structure as that of the shielding plate 90 except that the extended portion 92A is provided in place of the extended portion 92 of the shielding plate 90. The extended portion 92A is a cylindrical wall portion extending from the peripheral edge part of the disk-shaped body portion 91 toward the side of the spin base 21A and extending annually in the circumferential direction around the rotation axis a1 in the same manner as the extended portion 92. The extended portion 92A and the extended portion 92 are different from each other in that the shielding plate 90 includes the two restricting structures 94 in the tip side part thereof, while the extended portion 92A includes a plurality of restricting structures 94A in a tip side part thereof.

Moreover, the spin base 21A has the same structure as that of the spin base 21 except that a protrusion 26A is provided in the tip part of the draining portion 27 of the spin base 21 in place of the protrusion 26. The restricting structure 94A and the protrusion 26A form a restricting portion 201A for mutually restricting relative motion between the spin base 21A and the shielding plate 90A in the circumferential direction around the rotation axis a1.

The plurality of restricting structures 94A is provided continuously over a whole periphery in the circumferential direction of the tip side part of the extended portion 92A. Each of the restricting structures 94A is a recess formed in such a shape that at least a part of the protrusion 26A can be housed. Each of the restricting structures 94A penetrates the tip part of the extended portion 92A in the radial direction of the shielding plate 90A, and furthermore, is also opened downward from the tip part. In other words, the restricting structure 94A is opened in a direction toward the protrusion 26A protruded from the side surface part of the spin base 21A in the direction of the rotation axis a1. Note that even if the restricting structure 94A does not penetrate the tip part of the extended portion 92A in the radial direction of the shielding plate 90A like the restricting structure 94 shown in FIG. 6, the usefulness of the present invention is not damaged. In this case, it is possible to enhance a sealing property of the shielding plate 90A to seal the substrate 9.

A width W1 in the circumferential direction of an opening part on at least a lower side in the restricting structure 94A is gradually increased closer to the opening. Specifically, the restricting structure 94A includes side surfaces (slant surfaces) 943A and 944A opposed obliquely to each other in the circumferential direction around the rotation axis a1. The width W1 in the circumferential direction of the side surface 943A and the side surface 944A is gradually increased closer to a lower part.

The protrusion 26A is formed to take a shape of a pentagonal prism, for example, and an axial direction thereof is set along a radial direction of the spin base 21A. The protrusion 26A includes a horizontal bottom face 267A taking a rectangular shape, and rectangular side surfaces 265A and 266A standing upward from each of both ends of the bottom face 267A in the circumferential direction of the spin base 21A, that is, stands on the opening side of the restricting structure 94A. The side surfaces 265A and 266A are perpendicular planes. Slant surfaces 263A and 264A are connected to upper ends of the side surfaces 265A and 266A. The slant surface 263A and the slant surface 264A form a tip part (an upper end part) of the protrusion 26A. The slant surface 263A and the side surface 943A of the restricting structure 94A are substantially parallel with each other, and the slant surface 264A and the side surface 944A are also parallel with each other. A width W2 in the circumferential direction around the rotation axis a1 of the slant surface 263A and the slant surface 264A is gradually reduced closer to an upper part. In other words, at least the tip part of the protrusion 26A is opposed to the restricting structure 94A in the tip side part of the extended portion 92A, and the width W2 in the circumferential direction around the rotation axis a1 of the tip part is gradually reduced closer to the restricting structure 94. Moreover, the restricting structure 94A and the protrusion 26A are preferably formed respectively in such a manner that at least the tip side part of the protrusion 26A can be fitted in the opening part on at least the protrusion 26A side in the restricting structure 94A.

Here, consideration will be given to the case in which the shielding plate 90A is moved from a retreat position to a processing position in a state in which at least one of the spin base 21A and the shielding plate 90A is not disposed in an initial position in the circumferential direction, and any one of them is not locked to be rotated in the circumferential direction and the other is locked.

The plurality of restricting structures 94A is provided continuously over the whole periphery in the circumferential direction of the tip side part of the extended portion 92A. Accordingly, the tip of the protrusion 26A abuts on any one restricting structure 94A of the plurality of restricting structures 94A in the middle of the movement of the shielding plate 90A to the processing position. In most cases, the side surface 944A of the restricting structure 94 and the slant surface 264A of the protrusion 26A abut on each other or the side surface 943A of the restricting structure 94 and the slant surface 263A of the protrusion 26A abut on each other as shown in FIG. 10. In other words, the slant surfaces having substantially the same inclinations abut on each other.

When the shielding plate 90A is further moved to the processing position in this state, the extended portion 92A is moved to the processing position with a relative rotation in the circumferential direction with respect to the spin base 21A in such a manner that a top of the restricting structure 94A and the tip of the protrusion 26A approach each other in the circumferential direction in the process of the further movement of the shielding plate 90A to the processing position. Then, when the shielding plate 90A is disposed in the processing position as shown in FIG. 11, the tip side part of the protrusion 26A is housed in the restricting structure 94A. Consequently, the shielding plate 90A is restricted in the relative motion in the circumferential direction with respect to the spin base 21A.

When the shielding plate 90A is disposed in the processing position, moreover, the upper end of each of the restricting structures 94A and the upper end of the protrusion 26A are provided below the upper surface of the spin base 21A. Also in the case in which the processing solution discharged from the to-be-processed surface of the substrate 9 hits the restricting portion 201A and is thus splashed back, accordingly, the processing solution splashed back can be prevented from sticking to the non-processed surface of the substrate 9.

Note that the plurality of restricting structures 94A may be provided in the circumferential direction in the side surface part of the spin base 21A and the protrusion 26A may be provided in the tip side part of the extended portion 92A.

Figure 14:
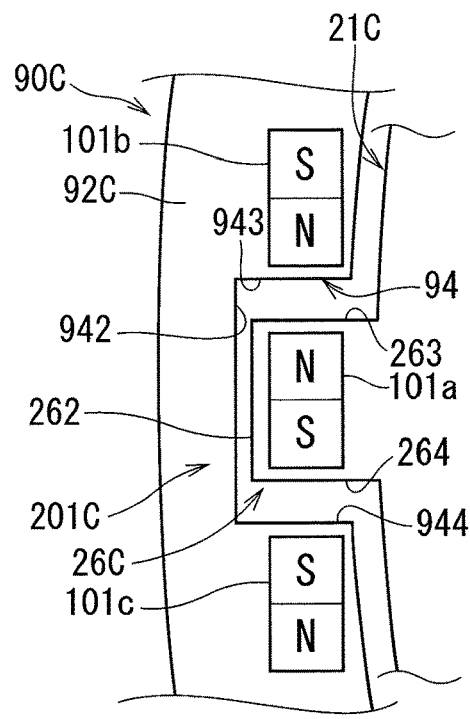
FIG. 14 is a cross sectional view showing another example of the structure of the restricting portion according to the first preferred embodiment of the present invention.
Figure 15:
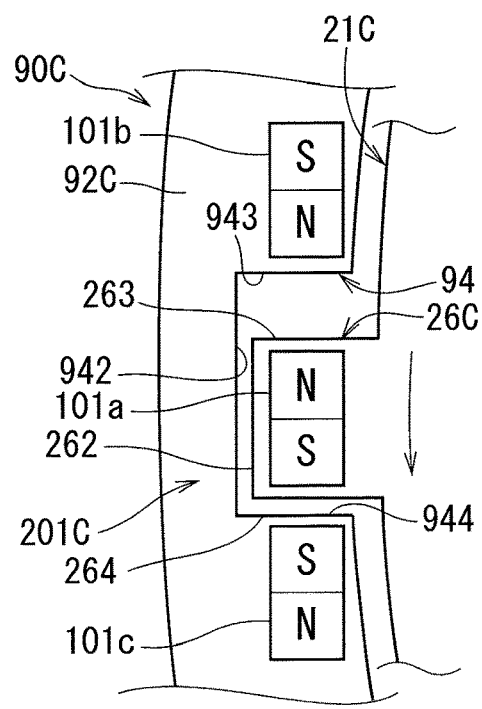
FIG. 15 is a cross sectional view showing another state of the restricting portion in FIG. 14.
Figure 16:
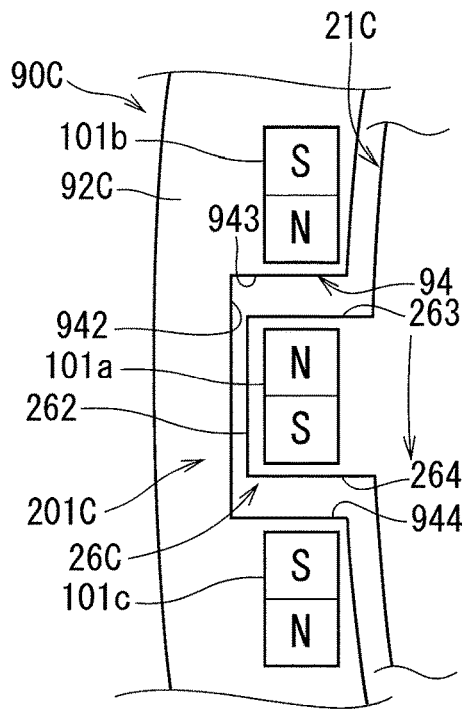
FIG. 16 is a cross sectional view showing another state of the restricting portion in FIG. 14.
Figure 17:
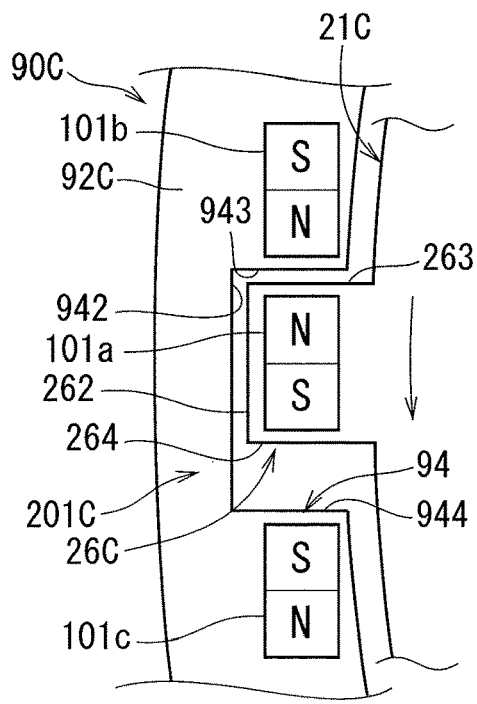
FIG. 17 is a cross sectional view showing another state of the restricting portion in FIG. 14.

FIGS. 14 to 17 are cross sectional views showing a restricting portion 201C formed by a shielding plate 90C and a spin base 21C as another example of the structure of the restricting portion formed by the shielding plate and the spin base in the substrate processing device according to the first preferred embodiment. The shielding plate 90C is disposed in a processing position. FIG. 14 shows the restricting portion 201 in a state in which the spin base 21 is stationary and FIG. 15 shows the restricting portion 201C during the rotation of the spin base 21C with acceleration. FIG. 16 shows the restricting portion 201C during the constant speed rotation of the spin base 21C and FIG. 17 shows the restricting portion 201C during the rotation of the spin base 21C with deceleration.

The spin base 21C is configured in the same manner as the spin base 21 except that a protrusion 26C is provided in place of the protrusion 26 of the spin base 21. The protrusion 26C is configured in the same manner as the protrusion 26 except that a magnet 101a is provided therein. The magnet 101a has an N pole disposed on the side surface 263 side and an S pole disposed on the side surface 264 side. The magnet 101a has the N and S poles provided in the protrusion 26C so as to be arranged sequentially in substantially the circumferential direction around the rotation axis a1.

The shielding plate 90C is configured in the same manner as the shielding plate 90 except that an extended portion 92C is provided in place of the extended portion 92 of the shielding plate 90. The extended portion 92C is configured in the same manner as the extended portion 92 except that magnets 101b and 101c are provided therein. The magnet 101b has N and S poles arranged sequentially in substantially the circumferential direction around the rotation axis a1, and furthermore, the N pole is provided at an upstream side in the rotating direction of the spin base 21C with respect to the restricting structure 94 so as to be closer to the side surface 943 of the restricting structure 94 than the S pole. The magnet 101c has N and S poles arranged sequentially in substantially the circumferential direction around the rotation axis a1, and furthermore, the S pole is provided at a downstream side in the rotating direction of the spin base 21C with respect to the restricting structure 94 so as to be closer to the side surface 944 of the restricting structure 94 than the N pole.

Thus, the magnets 101a to 101c are arranged in such a manner that the N pole of the magnet 101b and the N pole of the magnet 101a face each other and the S pole of the magnet 101a and the S pole of the magnet 101c face each other. Then, a magnetic repulsive force acts between the N poles and between the S poles. Moreover, it is preferable that the respective magnets 101a to 101c generate magnetic fields having substantially equal intensities to each other.

In other words, the magnets 101a to 101c cause a magnetic repulsive force to act to increase respective intervals between the protrusion 26C and each of the side surfaces 943 and 944 of restricting structure 94 disposed ahead of and behind the protrusion 26C in the circumferential direction around the rotation axis a1. By the magnetic repulsive force, the relative motion of the protrusion 26C in the circumferential direction with respect to the restricting structure 94 is restricted. Moreover, the magnets 101a to 101c may be provided in such a manner that the respective N and S poles of the magnets 101a to 101c are inverted each other.

When the spin base 21 is stationary as shown in FIG. 14, a force acting to increase an interval between the side surface 943 and the side surface 263 and a force acting to increase an interval between the side surface 944 and the side surface 264 become substantially equal to each other, and these intervals become substantially equal to each other. As shown in FIG. 16, also when the spin base 21 is rotated at a constant speed, these intervals become substantially equal to each other.

As shown in FIG. 15, when the spin base 21 is accelerated, a force for reducing the interval between the side surface 944 and the side surface 264 and increasing the interval between the side surface 943 and the side surface 263 further acts by the acceleration of the spin base 21 in addition to a magnetic repulsive force between the respective magnets. For this reason, the interval between the side surface 944 and the side surface 264 becomes greater than the interval between the side surface 943 and the side surface 263.

As shown in FIG. 17, when the spin base 21 is decelerated, a force for increasing the interval between the side surface 944 and the side surface 264 and reducing the interval between the side surface 943 and the side surface 263 further acts by the deceleration of the spin base 21 in addition to a magnetic repulsive force between the respective magnets. For this reason, the interval between the side surface 944 and the side surface 264 becomes smaller than the interval between the side surface 943 and the side surface 263.

The respective magnets 101a to 101c, the restricting structure 94 and the protrusion 26C form the restricting portion 201C for restricting the relative motion (position) of the shielding plate 90C with respect to the spin base 21C in the circumferential direction around the rotation axis a1.

As shown in FIGS. 14 to 17, when the shielding plate 90C is disposed in the processing position, it is preferable that the protrusion 26C and the restricting structure 94 of the extended portion 92C always restrict the motion in the circumferential direction around the rotation axis a1 each other in a non-constant state during acceleration and deceleration of the spin base 21. In this case, it is possible to completely prevent generation of dust due to the contact of the protrusion 26C and the restricting structure 94 of the extended portion 92C. Even if the protrusion 26C and the restricting structure 94 of the extended portion 92C come in contact with each other during the acceleration and deceleration of the spin base 21 due to a magnitude of the repulsive force caused to act by each magnet or a magnitude of the acceleration of the spin base 21C, it is possible to reduce an impact in the contact greatly as compared with the case in which the respective magnets 101a to 101c are not provided. Even if the protrusion 26C and the restricting structure 94 of the extended portion 92C come in contact with each other during the acceleration and deceleration of the spin base 21, accordingly, the usefulness of the present invention is not damaged.

Figure 18:
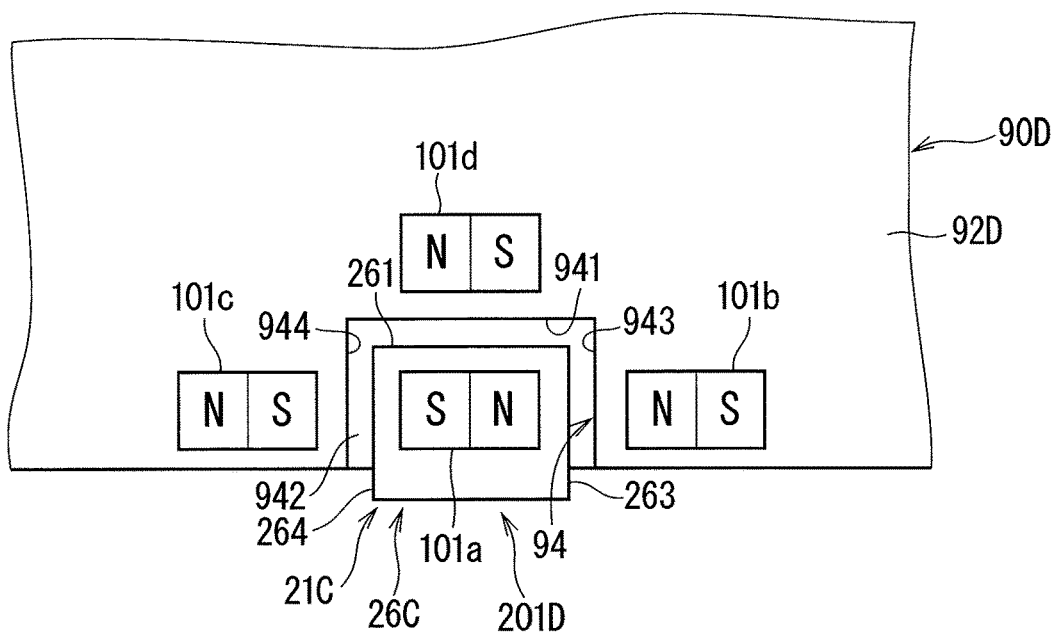
FIG. 18 is a sectional view showing another example of the structure of the restricting portion according to the first preferred embodiment of the present invention.
Figure 19:
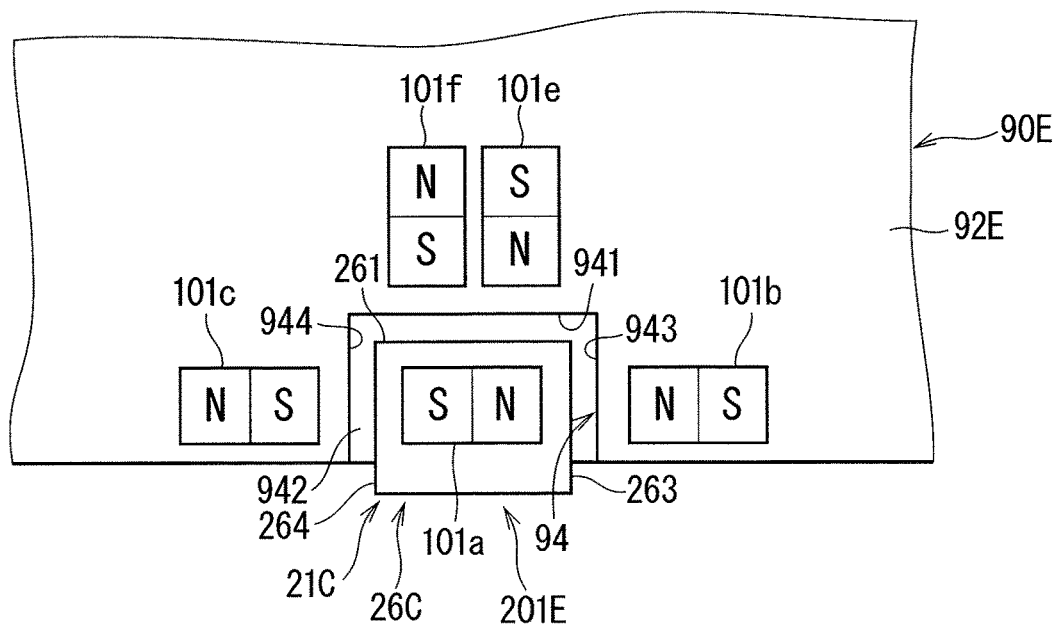
FIG. 19 is a sectional view showing another example of the structure of the restricting portion according to the first preferred embodiment of the present invention.

FIG. 18 is a sectional view showing a restricting portion 201D formed by an extended portion 92D and the spin base 21C as another example of the structure of the restricting portion formed by the shielding plate and the spin base in the substrate processing device according to the first preferred embodiment. FIG. 19 is a sectional view showing a restricting portion 201E formed by an extended portion 92E and the spin base 21C as another example of the structure of the restricting portion formed by the shielding plate and the spin base in the substrate processing device according to the first preferred embodiment. FIGS. 18 and 19 are sectional views in which the restricting portions 201D and 201E parts are cut by a cylinder around the rotation axis a1, respectively.

The spin base 21C shown in FIGS. 18 and 19 has the same structure as that of the spin base 21C shown in FIG. 14. A shielding plate 90D of FIG. 18 is configured in the same manner as the shielding plate 90C except that the extended portion 92D is provided in place of the extended portion 92C of the shielding plate 90C in FIG. 14. The extended portion 92D is configured in the same manner as the extended portion 92C except that a magnet 101d is further provided therein. It is preferable that respective magnets 101a to 101e generate magnetic fields having substantially equal intensities to each other. The magnet 101d has N and S poles provided to be sequentially arranged in substantially the circumferential direction around the rotation axis a1 along the upper surface 941 of the restricting structure 94. The N pole of the magnet 101d faces an N pole of the magnet 101a and the S pole of the magnet 101d faces an S pole of the magnet 101a. Consequently, a magnetic repulsive force acts between the magnets 101a and 101d. Thus, a force for increasing an interval between the upper surface 941 and the upper surface 261 acts.

The magnets 101a to 101c cause a magnetic repulsive force to act. The magnetic repulsive force serves to increase the respective intervals between the side surfaces 943 and 944 of the restricting structure 94 and the protrusion 26C in the circumferential direction around the rotation axis a1. Furthermore, the magnets 101a and 101d cause a magnetic repulsive force to act in order to increase the interval between the upper surface 941 of the restricting structure 94 and the upper surface 261 of the protrusion 26C in the direction of the rotation axis a1 (the perpendicular direction). Consequently, motion in which the upper surface 941 and the upper surface 261 approach each other is restricted and a mutual contact is also suppressed. Therefore, it is possible to further suppress the generation of dust due to the contact of the restricting structure 94 and the protrusion 26C.

The respective magnets 101a to 101d, the restricting structure 94 and the protrusion 26C form the restricting portion 201D for restricting the relative motion (position) of the shielding plate 90C with respect to the spin base 21C in both the circumferential direction around the rotation axis a1 and the perpendicular direction.

A shielding plate 90E of FIG. 19 is configured in the same manner as the shielding plate 90C except that the extended portion 92E is provided in place of the extended portion 92C of the shielding plate 90C in FIG. 14. The extended portion 92E is configured in the same manner as the extended portion 92C except that magnets 101e and 101f are further provided therein. It is preferable that the respective magnets 101a to 101c, 101e and 101f generate magnetic fields having substantially equal intensities to each other. The magnet 101e is provided above the upper surface 941 of the restricting structure 94 in such a manner that an N pole thereof is close to the upper surface 941 and an S pole is positioned thereabove. Moreover, the N pole of the magnet 101d and the N pole of the magnet 101a face each other. The magnet 101f is provided above the upper surface 941 of the restricting structure 94 in such a manner that an S pole thereof is close to the upper surface 941 and an N pole is positioned thereabove. Moreover, the S pole of the magnet 101d and the S pole of the magnet 101a face each other.

Consequently, a magnetic repulsive force acts between the magnets 101a and 101e, and furthermore, a magnetic repulsive force also acts between the magnets 101a and 101f. Consequently, a force for increasing the interval between the upper surfaces 941 and 261 acts.

The magnets 101a to 101e cause a magnetic repulsive force to act. The magnetic repulsive force serves to increase the respective intervals between the side surfaces 943 and 944 of the restricting structure 94 and the protrusion 26C in the circumferential direction around the rotation axis a1. Furthermore, the magnets 101a, 101e and 101f cause a magnetic repulsive force to act in order to increase the interval between the upper surface 941 of the restricting structure 94 and the upper surface 261 of the protrusion 26C in the direction of the rotation axis a1 (the perpendicular direction). Consequently, the motion in which the upper surface 941 and the upper surface 261 approach each other is restricted and the mutual contact is also suppressed.

Therefore, it is possible to further suppress the generation of the dust due to the contact of the restricting structure 94 and the protrusion 26C.

The respective magnets 101a to 101c, 101e and 101f, the restricting structure 94 and the protrusion 26C form the restricting portion 201E for restricting the relative motion (position) of the shielding plate 90C with respect to the spin base 21C in both the circumferential direction around the rotation axis a1 and the perpendicular direction.

According to the substrate processing device in accordance with the first preferred embodiment having the structure described above, the extended portion 92 extends from the peripheral edge part of the body portion 91 of the shielding plate 90 to the side of the spin base 21. The protrusion 26 is provided in one part of the tip side part of the extended portion 92 and the side surface part of the spin base 21, and furthermore, the restricting structure 94 is provided in the other part. The protrusion 26 and the restricting structure 94 are disposed below the upper surface of the spin base 21. Accordingly, the processing solution discharged from the substrate 9 can be prevented from being splashed back by the protrusion 26 or the restricting structure 94 to stick to the non-processed surface of the substrate 9.

According to the substrate processing device in accordance with the first preferred embodiment having the structure described above, moreover, at least one of the protrusion 26 and the restricting structure 94 has a part opposed to the other and is covered with the elastic member. Therefore, it is possible to suppress an impact in the contact of the protrusion 26 and the restricting structure 94.

According to the substrate processing device in accordance with the first preferred embodiment having the structure described above, furthermore, the shielding plate 90 is relatively moved with respect to the spin base 21 in the direction of the rotation axis a1 between the processing position in which the restricting structure 94 is disposed opposite to the protrusion 26 from ahead of and behind the protrusion 26 in the circumferential direction around the rotation axis a1 and the retreat position in which the restricting structure 94 is disposed relatively apart from the protrusion 26 in the direction of the rotation axis a1. Consequently, it is possible to easily switch the restricting state in which the restricting structure 94 restricts the relative motion in the circumferential direction of the protrusion 26 and the release state in which the restriction is not performed.

According to the substrate processing device in accordance with the first preferred embodiment having the structure described above, moreover, the restricting structure 94 is the recess formed so as to be capable of house at least a part of the protrusion 26. Accordingly, the tip side part of the extended portion 92 of the shielding plate 90 and the side surface part of the spin base 21 can be caused to approach each other. Therefore, it is possible to reduce a size of the shielding plate 90.

According to the substrate processing device in accordance with the first preferred embodiment having the structure described above, furthermore, the protrusion 26A abuts on an opposed recess of the plurality of recesses (the restricting structure 94A) in the process in which the shielding plate 90A is relatively moved with respect to the spin base 21A from the retreat position to the processing position. In the state in which the rotation of the shielding plate 90A around the rotation axis a1 is not restricted, the shielding plate 90A is moved to the processing position in the direction of the rotation axis a1 while the relative position in the circumferential direction of the shielding plate 90A with respect to the spin base 21A is corrected in such a manner that the protrusion 26A is guided from the recess to a more deeply recessed part due to the respective shapes of the recess and the protrusions 26A after the tip part of the protrusion 26A abuts on the recess. After the shielding plate 90A is moved to the processing position, the recess restricts the motion of the protrusion 26A in the circumferential direction and the relative motion in the circumferential direction of the shielding plate 90A with respect to the spin base 21A is restricted. Even if the relative position in the circumferential direction of the shielding plate 90A with respect to the spin base 21A is not aligned, accordingly, the recess of the plurality of recesses which is opposed to the protrusion 26A forms a restricting structure for restricting the relative motion of the protrusion 26A in the circumferential direction. Consequently, it is possible to restrict the relative motion in the circumferential direction of the shielding plate 90A with respect to the spin base 21A.

According to the substrate processing device in accordance with the first preferred embodiment having the structure described above, moreover, the plurality of magnets 101a and 101b causes the magnetic repulsive force to act in order to increase the respective intervals between the protrusion 26C and the respective portions of the restricting structure 94 disposed ahead of and behind the protrusion 26C in the circumferential direction. Consequently, the relative motion of the protrusion 26C in the circumferential direction with respect to the restricting structure 94 is restricted. Accordingly, it is possible to suppress the contact of the restricting structure 94 and the protrusion 26C.

According to the substrate processing device in accordance with the first preferred embodiment having the structure described above, furthermore, the restricting structure 94 includes the upper surface 941 disposed opposite to the protrusion 26C in the direction of the rotation axis a1. The plurality of magnets 101a and 101d (101e and 101f) causes the magnetic repulsive force to act in order to increase the interval between the protrusion 26C and the upper surface 941 in the direction of the rotation axis a1. Consequently, motion for the protrusion 26C to approach the upper surface 941 in the direction of the rotation axis a1 is restricted. Accordingly, it is possible to further suppress the contact of the restricting structure 94 and the protrusion 26C.

According to the substrate processing device in accordance with the first preferred embodiment having the structure described above, moreover, the protrusion 92 is the cylindrical wall portion provided along the peripheral edge part of the shielding plate 90. Therefore, the extended portion 92 does not cross the flow of the processing solution discharged from the surface of the substrate 9 to the outside by centrifugal force. Consequently, it is possible to suppress scattering of the processing solution in the extended portion 92. Therefore, the processing solution can further be prevented from being splashed back by the protrusion 26 or the restricting structure 94 to stick to the non-processed surface of the substrate 9.

According to the substrate processing device in accordance with the first preferred embodiment having the structure described above, furthermore, the inner peripheral surface 921 of the cylindrical wall portion (the extended portion 92) includes the curved surface which is continuous with the lower surface of the shielding plate 90, and furthermore, is convexly curved obliquely upward and outward with respect to the upper surface of the spin base 21. The processing solution discharged from the surface of the substrate 9 to the outside by the centrifugal force easily flows smoothly along the inner peripheral surface 921. Therefore, the processing solution is easily discharged from the clearance G1 between the inner peripheral surface 921 and the spin base 21 to the outside.

According to the substrate processing device in accordance with the first preferred embodiment having the structure described above, furthermore, the shielding plate 90 includes the annular recess 922 formed in a portion of the inside surface 901 surrounding the upper surface and the end face of the substrate 9, the portion being disposed between the tip side part of the extended portion 92 and the opposed part of the inside surface opposed to the substrate 9, and the annular recess 922 is recessed upward relative to the peripheral edge part of the opposed portion. Consequently, the annular space 923 bulged upward relative to the opposed part is formed on the outside of the peripheral edge part of the substrate 9. Therefore, the processing solution supplied to the substrate 9, discharged from the substrate 9 and then splashed back from the inner peripheral surface 921 of the extended portion 92 can be prevented from sticking to the non-processed surface of the substrate 9.

According to the substrate processing device in accordance with the first preferred embodiment having the structure described above, moreover, the spin base 21 and the shielding plate 90 are rotated at the same speed in the same direction around the rotation axis a1. Therefore, it is possible to suppress generation of an air flow toward the center c1 side of the substrate 9 between the upper surface of the substrate 9 and the lower surface of the shielding plate 90. Consequently, it is possible to further prevent the processing solution from sticking to the non-processed surface of the substrate 9. According to the substrate processing device in accordance with the first preferred embodiment having the structure described above, furthermore, the curved surface convexly curved obliquely upward and outward with respect to the upper surface of the spin base 21 is formed in the portion of the inside surface 901 positioned more outward than the annular recess 922 in the radial direction of the shielding plate 90. Consequently, the processing solution emitted to the substrate 9 and discharged from the substrate 9 easily flows to the tip side of the extended portion 92 along the curved surface. Accordingly, it is possible to prevent the processing solution from being splashed back from the portion which is disposed, in the inside surface 901 of the shielding plate 90, more outward than the annular recess 922 in the radial direction. Therefore, the processing solution can further be prevented from sticking to the non-processed surface of the substrate 9.

2. Referring to Second Preferred Embodiment

<2-1. Structure of Substrate Processing Device 1A>

Figure 20:
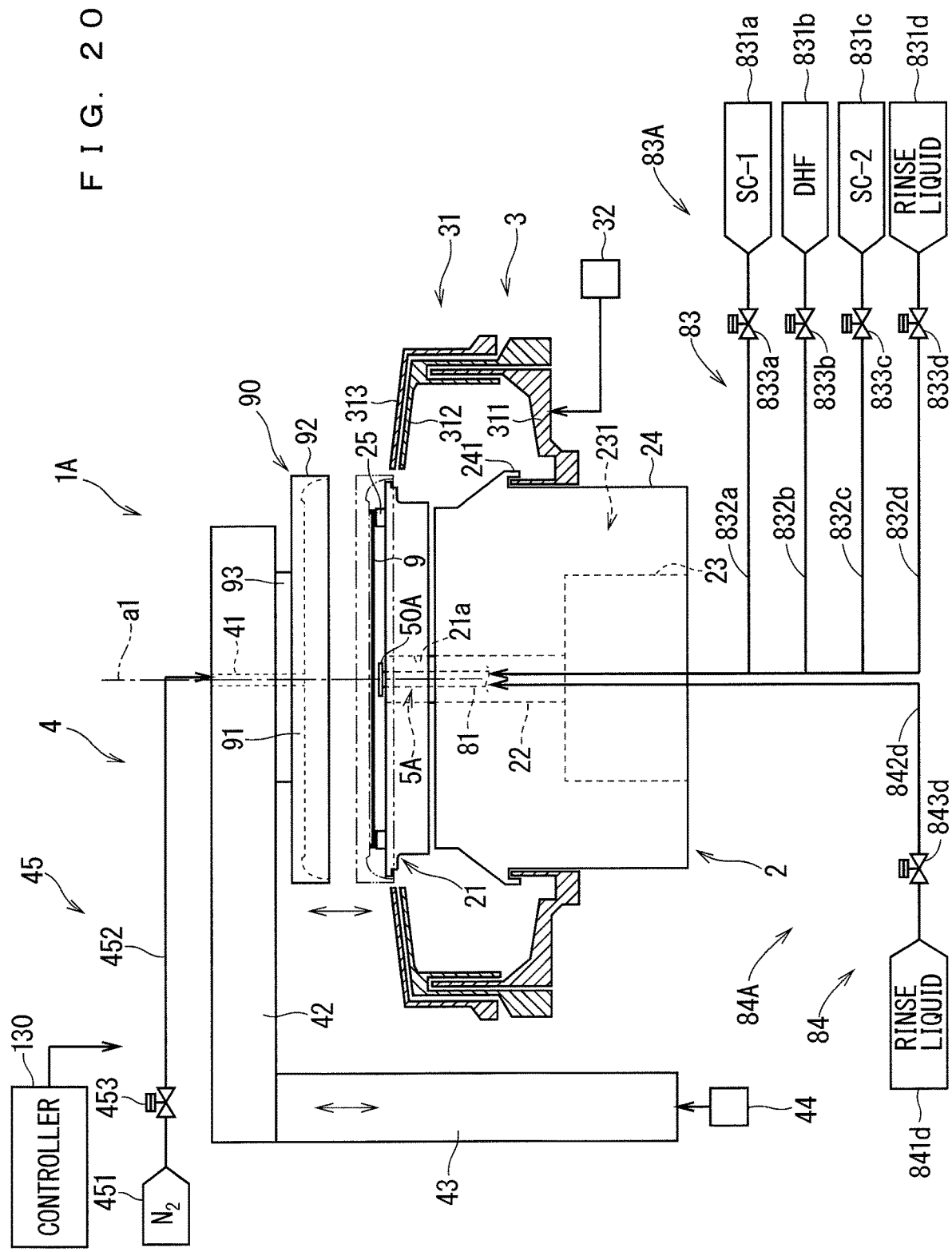
FIG. 20 is a schematic view for explaining a structure of a substrate processing device according to a second preferred embodiment of the present invention.

FIG. 20 is a schematic view for explaining a structure of a substrate processing device 1A. The substrate processing device 1A has the same structure as that of the substrate processing device 1 except that a processing portion 5A is provided in place of the processing portion 5 of the substrate processing device 1 and a rinse liquid supplying portion 84 is further provided. In other words, the substrate processing device 1A has the structure shown in FIGS. 2 to 9 in the same manner as in the substrate processing device 1. FIG. 20 shows a state in which a shielding plate 90 is disposed in a retreat position. Moreover, the shielding plate 90 disposed in a processing position is shown in a virtual line. Furthermore, the substrate processing device 1A can employ another example of the structures of the shielding plate and the spin base shown in FIGS. 10 to 13 and can employ another example of the structure of the restricting portion shown in FIGS. 14 to 19 in the same manner as the substrate processing device 1. Referring to the substrate processing device 1A, accordingly, description will be given to a different structure from that of the substrate processing device 1. Referring to the same structure, a part or whole of the description will be omitted except for reference in the description of the different structure.

<Processing Portion 5A>

The processing portion 5A performs a processing for a to-be-processed surface (a lower surface in the example of FIG. 20) of a substrate 9 held by a spin base 21. Specifically, the processing portion 5A supplies a processing solution to the to-be-processed surface of the substrate 9 held by the spin base 21, that is, the lower surface. Moreover, the processing portion 5A supplies a rinse liquid along an upper surface of the spin base 21 to clean the upper surface.

As shown in FIG. 20, the processing portion 5A includes a supply pipe 81 disposed in penetration through a hollow part of a rotating shaft portion 22 of a spin chuck 2 and a through hole 21a, for example. A nozzle 50A is connected to a tip of the supply pipe 81 (an end on the substrate 9 side). A processing solution supply pipe 811 and a rinse liquid supply pipe 812 are inserted in the supply pipe 81. A processing solution supplying portion 83 to be a piping system for supplying the processing solution to the processing solution supply pipe 811 is connected thereto. A rinse liquid supplying portion 84 to be a piping system for supplying a rinse liquid to the rinse liquid supply pipe 812 is connected thereto.

Figure 21:
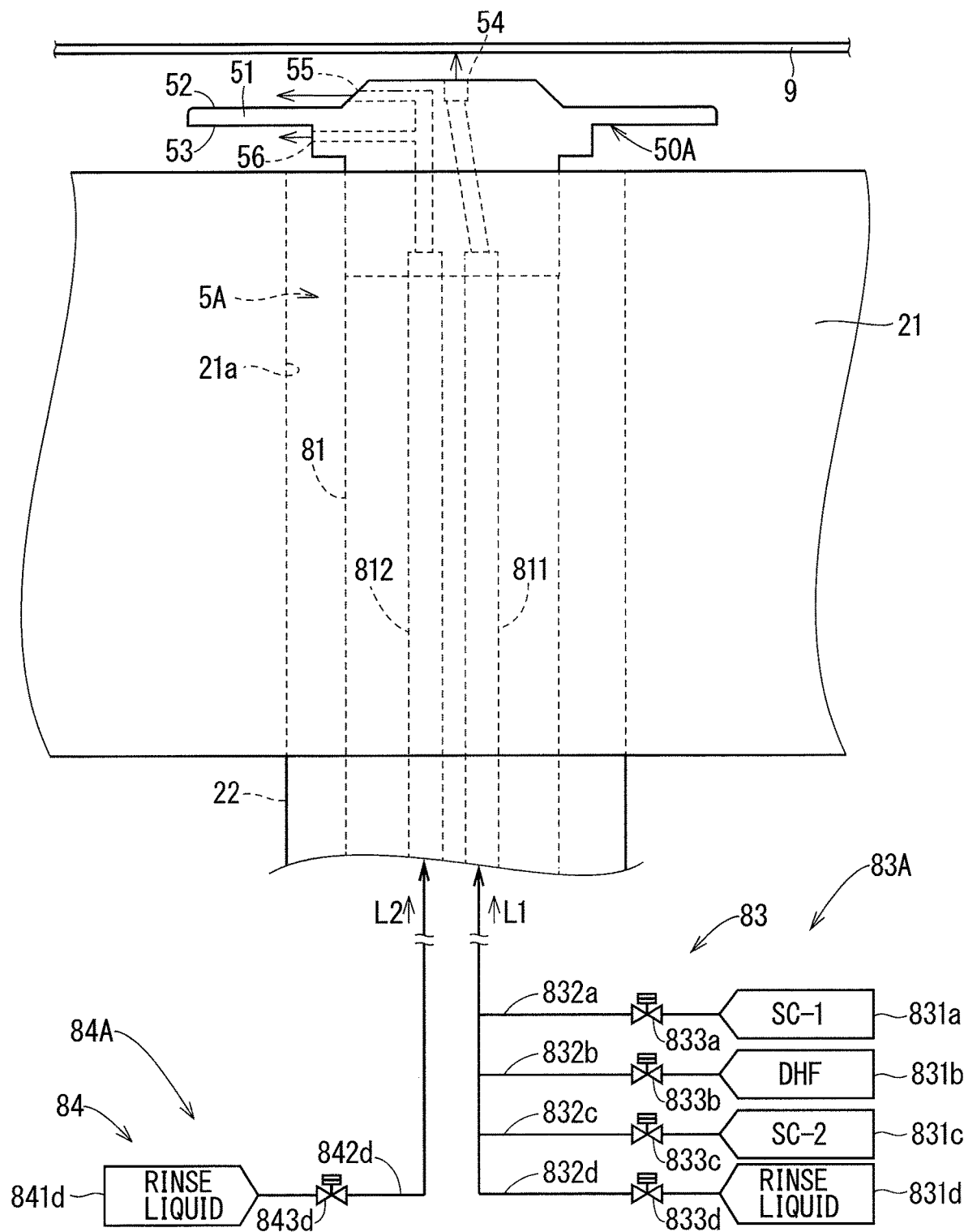
FIG. 21 is a schematic view for explaining a structure of a nozzle in FIG. 20.

FIG. 21 is a schematic view for explaining a structure of the nozzle 50A. The nozzle 50A includes a circular plate-shaped member 51 opposed in substantially parallel, with a clearance, to surfaces of both a central part of the lower surface of the substrate 9 and the upper surface of the spin base 21. A central axis of the plate-shaped member 51 is a rotation axis a1 in the same manner as the rotating shaft portion 22. A diameter of the plate-shaped member 51 is set to be substantially equal to or slightly larger than a diameter of the rotating shaft portion 22, for example.

The plate-shaped member 51 has an upper surface 52 opposed in substantially parallel to the lower surface of the substrate 9, and a lower surface 53 opposed in substantially parallel with a central part of the upper surface of the spin base 21. A central part of the upper surface 52 takes a convex shape toward the substrate 9 side from a peripheral edge part of the upper surface 52, and a central part of the lower surface 53 takes a convex shape toward the upper surface side of the spin base 21 from the central part of the lower surface 53. In the example of FIG. 21, the central part of the upper surface 52 is formed in a shape of a truncated cone and the central part of the lower surface 53 is formed in a shape of a disk.

A processing solution discharging port 54 having an opening opposed to the center of the substrate 9 is provided in the central part of the upper surface 52 of the plate-shaped member 51. The processing solution discharging port 54 is connected to the processing solution supply pipe 811. The processing solution discharging port 54 discharges the processing solution supplied from the processing solution supplying portion 83 through the processing solution supply pipe 811 in an substantially perpendicular direction from below the central part of the substrate 9 toward the central part of the lower surface of the substrate 9. Moreover, a rinse liquid discharging port (a "cleaning liquid discharging port") 55 is provided on a side surface of the central part of the upper surface 52, and a rinse liquid discharging port 56 is provided on a side surface of the central part of the lower surface 53. The rinse liquid discharging ports 55 and 56 are connected to the rinse liquid supply pipe 812, respectively. The rinse liquid discharging ports 55 and 56 discharge the rinse liquid supplied from the rinse liquid supplying portion 84 through the rinse liquid supply pipe 812 outward in the radial direction of the spin base 21 along the upper surface of the spin base 21, respectively. In more detail, the rinse liquid discharging port 55 discharges the rinse liquid outward in the radial direction of the spin base 21 along the surfaces of both the upper surface 52 and the upper surface of the spin base 21, and the rinse liquid discharging port 56 discharges the rinse liquid outward in the radial direction of the spin base 21 along the surfaces of both the lower surface 53 and the upper surface of the spin base 21.

The nozzle 50A may include only any one of the rinse liquid discharging ports 55 and 56. Moreover, a side surface discharging port formed on an outer peripheral surface (a side surface) of the plate-shaped member 51 and discharging the rinse liquid outward in the radial direction of the spin base 21 along the upper surface of the spin base 21 may be provided in place of the rinse liquid discharging ports 55 and 56 or in addition to at least one of the rinse liquid discharging ports 55 and 56.

Note that the substrate processing device 1A may further be provided with a nozzle capable of supplying the processing solution to an upper surface of the substrate 9 (in more detail, the whole upper surface or a peripheral edge part). Such a nozzle is provided on the shielding plate 90, for example.

The rinse liquid supplying portion 84 specifically includes a rinse liquid supply source 841$d$, a pipe 842$d$ and a switching valve 843$d$.

The nozzle 50A can discharge SC-1, DHF and SC-2 supplied from an SC-1 supply source 831$a$, a DHF supply source 831$b$ and an SC-2 supply source 831$c$ in the same manner as the nozzle 50 of the substrate processing device 1.

The rinse liquid supply sources 831$d$ and 841$d$ are supply sources for supplying the rinse liquid. Here, the rinse liquid supply sources ("cleaning liquid supply sources") 831$d$ and 841$d$ supply pure water as the rinse liquid, for example. The rinse liquid supply source 831$d$ is connected to the processing solution supply pipe 811 through a pipe 832$d$ having a switching valve 833$d$ inserted therebetween. When the switching valve 833$d$ is opened, accordingly, the rinse liquid supplied from the rinse liquid supply source 831$d$ is discharged from the processing solution discharging port 54 of the nozzle 50A. Moreover, the rinse liquid supply source 841$d$ is connected to the rinse liquid supply pipe 812 through the pipe 842$d$ having the switching valve 843$d$ inserted therebetween. When the switching valve 843$d$ is opened, accordingly, the rinse liquid supplied from the rinse liquid supply source 841$d$ is discharged from the rinse liquid discharging ports 55 and 56 of the nozzle 50A. Note that as the rinse liquid, it is also possible to use pure water, warm water, ozone water, magnetic water, reduced water (hydrogen water), various organic solvents (ion water, IPA (isopropyl alcohol), function water ($CO_2$ water, etc.) or the like.

When the processing solution (SC-1, DHF, SC-2 or the rinse liquid) is supplied from the processing solution supplying portion 83 to the processing solution supply pipe 811, the processing solution is discharged from the processing solution discharging port 54 of the nozzle 50A toward the vicinity of the center of the to-be-processed surface of the substrate 9 held by the spin base 21. When the rinse liquid is supplied from the rinse liquid supplying portion 84 to the rinse liquid supply pipe 812, moreover, the rinse liquid is discharged from the rinse liquid discharging ports 55 and 56 of the nozzle 50A outward in the radial direction of the spin base 21 along the upper surface of the spin base 21. However, each of the switching valves 833$a$, 833$b$, 833$c$ and 833$d$ provided in the processing solution supplying portion 83 and the switching valve 843$d$ provided in the rinse liquid supplying portion 84 are electrically connected to the controller 130 and are opened/closed under control of the controller 130. In other words, a discharging mode of the processing solution (that is, the processing solution and the rinse liquid) from the nozzle 50A (specifically, a type of the processing solution to be discharged, a discharging start timing, a discharging end timing, a discharging flow rate or the like) is controlled by the controller 130.

Note that the nozzle 50A can perform the discharge of the processing solution from the processing solution discharging port 54 and the discharge of the rinse liquid from the rinse liquid discharging ports 55 and 56 simultaneously, and the nozzle 50A capable of selectively performing the discharge of the processing solution and the discharge of the rinse liquid, the supply pipe 81 and the processing solution supplying portion 83 form a processing solution discharging portion 83A for discharging the processing solution to the to-be-processed surface of the substrate 9 under the control of the controller 130. The nozzle 50A, the supply pipe 81 and the rinse liquid supplying portion 84 form a rinse liquid discharging portion 84A for discharging the rinse liquid outward in the radial direction of the spin base 21 along the upper surface of the spin base 21.

<2-2. Referring to Operation of Substrate Processing Device>

Figure 22:
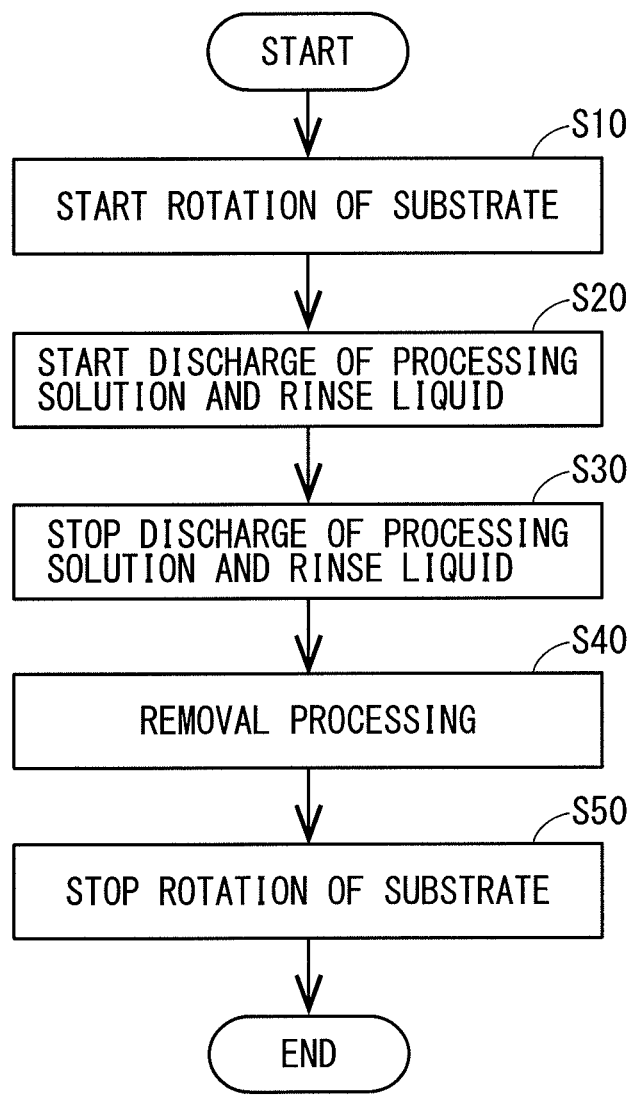
FIG. 22 is a flowchart showing an example of an operation of the substrate processing device according to the second preferred embodiment of the present invention.

FIG. 22 is a flowchart showing an example of an operation of the substrate processing device 1A. The operation of the substrate processing device 1A will be described below based on the flowchart of FIG. 22. The flowchart shows an operation for the substrate processing device 1A to perform a processing for the lower surface of the substrate 9 using the processing solution and cleaning for the upper surface of the spin base 21 using the rinse liquid from a state in which the spin base 21 has already held the substrate 9.

When the substrate processing device 1A performs the processing for the lower surface of the substrate 9 with the processing solution supplied by the processing solution supplying portion 83 and the cleaning for the upper surface of the spin base 21 with the rinse liquid supplied by the rinse liquid supplying portion 84, the controller 130 first drives a rotational drive 23 to rotate the spin base 21 holding the substrate 9, thereby starting the rotation of the substrate 9 (step S10).

The substrate processing device 1A controls the processing solution supplying portion 83 and the rinse liquid supplying portion 84 to start the discharge of the processing solution and the rinse liquid in the state in which the substrate 9 is rotated (step S20). Specifically, the controller 130 selectively opens the switching valves 833$a$ to 833$d$, thereby causing the processing solution supplying portion 83 to start the supply of the processing solution (SC-1, DHF, SC-2 or the rinse liquid), for example. The processing solution is supplied to the processing solution discharging port 54 of the nozzle 50A through the processing solution supply pipe 811 and the processing solution discharging port 54 starts to discharge the processing solution toward the lower surface of the substrate 9. The processing solution discharged to the lower surface spreads toward the peripheral edge side of the substrate 9 over the lower surface of the substrate 9 which is being rotated, in such a manner that among the lower surface of the substrate 9 and the spin base 21, the processing solution comes in contact only with the lower surface of the substrate 9 without coming in contact with the spin base 21.

The controller 130 opens the switching valve 843d to cause the rinse liquid supplying portion 84 to start the supply of the rinse liquid simultaneously with the start of the supply of the processing solution. The rinse liquid is supplied to the rinse liquid discharging ports 55 and 56 of the nozzle 50A through the rinse liquid supply pipe 812, and the rinse liquid discharging ports 55 and 56 start to discharge the rinse liquid outward in the radial direction of the spin base 21 along the upper surface of the spin base 21.

The discharged rinse liquid spreads toward the peripheral edge side of the spin base 21 over the upper surface of the spin base 21 which is being rotated, in such a manner that among the lower surface of the substrate 9 and the upper surface of the spin base 21, the rinse liquid comes in contact only with the upper surface of the spin base 21 without coming in contact with the lower surface of the substrate 9. Consequently, the substrate processing device 1A simultaneously performs the processing for the lower surface of the substrate 9 with the processing solution and the processing for cleaning the upper surface of the spin base 21. A rotating speed of a substrate W during the processing is set to be 300 rpm, for example. A processing time is set to be 30 seconds or the like, for example.

When the processing for the lower surface of the substrate 9 is ended, the substrate processing device 1A controls the processing solution supplying portion 83 and the rinse liquid supplying portion 84 to stop the discharge of the processing solution and the rinse liquid in the state in which the substrate 9 is being rotated (step S30). Specifically, the controller 130 closes the switching valves 833a to 833d to cause the processing solution supplying portion 83 to stop the supply of the processing solution, for example. Consequently, the processing solution discharging port 54 stops the discharge of the processing solution toward the lower surface of the substrate 9. The controller 130 closes the switching valve 843d to cause the rinse liquid supplying portion 84 to stop the supply of the rinse liquid simultaneously with the stop of the discharge of the processing solution. Consequently, the rinse liquid discharging ports 55 and 56 stop the discharge of the rinse liquid.

The processing for the lower surface of the substrate 9 through the discharge of the processing solution and the processing for the upper surface of the spin base 21 through the discharge of the rinse liquid may be performed simultaneously as described above or may be performed sequentially.

When the processing for the lower surface of the substrate 9 and the processing for cleaning the upper surface of the spin base 21 with a cleaning liquid are ended, the controller 130 controls the rotational drive 23 to rotate the spin base 21 at a high speed so that the substrate processing device 1A performs a removal processing for removing a solution such as the processing solution sticking to the substrate 9 and the nozzle 50A or the rinse liquid to dry the substrate 9 and the nozzle 50A (a "solution removal processing") (step S40).

When the solution removal processing is ended, the controller 130 of the substrate processing device 1A controls the rotational drive 23 to stop the rotation of the spin base 21 (step S50) and to end a series of substrate processing.

By any of the substrate processing method according to the second preferred embodiment described above and the substrate processing device according to the second preferred embodiment having the structure described above, the cleaning liquid is discharged outward in the radial direction of the spin base 21 along the upper surface of the spin base 21. Consequently, it is possible to clean the upper surface of the spin base 21 with the cleaning liquid and to wash away the processing solution dropping from the lower surface of the substrate 9 with the cleaning liquid before the processing solution sticks to the upper surface of the spin base 21 while suppressing mixture of the cleaning liquid with the processing solution hitting the lower surface of the substrate 9 to stick to the lower surface. Accordingly, it is possible to suppress the processing solution supplied to the lower surface of the substrate 9 from dropping and sticking onto the spin base 21 and remaining as it is.

By any of the substrate processing method according to the second preferred embodiment described above and the substrate processing device according to the second preferred embodiment having the structure described above, moreover, the discharge of the processing solution to the lower surface of the substrate 9 and the discharge of the cleaning liquid along the upper surface of the spin base 21 are performed simultaneously. Therefore, it is possible to efficiently prevent the processing solution discharged to the back face of the substrate 9 from sticking to the upper surface of the spin base 21.

By any of the substrate processing method according to the second preferred embodiment described above and the substrate processing device according to the second preferred embodiment having the structure described above, furthermore, the cleaning liquid is discharged outward in the radial direction of the spin base 21 along the surfaces of both the upper or lower surface of the plate-shaped member 51 of the nozzle 50A and the upper surface of the spin base 21. Therefore, it is also possible to clean the nozzle 50A during the cleaning for the spin base 21.

By any of the substrate processing method according to the second preferred embodiment described above and the substrate processing device according to the second preferred embodiment having the structure described above, moreover, the cleaning liquid is discharged outward in the radial direction of the spin base 21 along the upper surface of the spin base 21 from the rinse liquid discharging ports 55 and 56 provided on the side surface of the plate-shaped member 51 of the nozzle 50A. Accordingly, it becomes easy to lengthen the shapes of the rinse liquid discharging ports 55 and 56 in the circumferential direction of the plate-shaped member 51, thereby spreading the cleaning liquid to be discharged.

3. Referring to Third Preferred Embodiment

<3-1. Structure of Substrate Processing Device 1B>

FIG. 23 is a schematic view for explaining a structure of a substrate processing device 1B. The substrate processing device 1B has the same structure as that of the substrate processing device 1 except that a cleaning portion 6 and a rinse liquid supplying portion 85 are further provided. In other words, the substrate processing device 1B has the structure shown in FIGS. 2 to 9 in the same manner as the substrate processing device 1. FIG. 23 shows a state in which a shielding plate 90 is disposed in a retreat position. Moreover, the shielding plate 90 disposed in a processing position is shown in a virtual line. Furthermore, the substrate processing device 1B can employ another example of the structures of the shielding plate and the spin base shown in FIGS. 10 to 13 and can employ another example of the structure of the restricting portion shown in FIGS. 14 to 19 in the same manner as the substrate processing device 1.

Referring to the substrate processing device 1B, accordingly, description will be given to a different structure from that of the substrate processing device 1. Referring to the same structure, a part or whole of the description will be omitted except for reference in the description of the different structure.

<Cleaning Portion 6>

A cleaning portion 6 performs a cleaning processing for both a side surface of a spin base 21 and an inner member 312 of a splash guard 31. Specifically, the cleaning portion 6 supplies a processing solution to a lower surface of a flange portion 29 (FIG. 6) of the spin base 21 from below the flange portion 29. As shown in FIG. 23, the cleaning portion 6 includes a plurality of (for example, four) rinse liquid discharging ports 86 and a plurality of (for example, two) rinse liquid discharging ports 87 which are provided on a side surface of a casing 24 of a spin chuck 2, for example.

The plurality of rinse liquid discharging ports 86 is distributed and provided in a circumferential direction of the spin base 21 below a lower surface of the flange portion 29 of the spin base 21 (more preferably, a curved surface 211 (FIG. 6) to be a lower surface of a base end part of the flange portion 29), facing the lower surface. Each of the rinse liquid discharging ports 86 is configured to enable the rinse liquid to be discharged upward in a perpendicular direction toward the lower surface of the flange portion 29 (more preferably, the curved surface 211).

The plurality of rinse liquid discharging ports 87 is distributed and provided in the circumferential direction of the spin base 21 opposite to a peripheral edge part of a lower surface of a disk-shaped base 28 (FIG. 6) of the spin base 21 and below the peripheral edge part. Each of the rinse liquid discharging ports 87 is configured to enable the rinse liquid to be discharged upward in the perpendicular direction toward the peripheral edge part of the lower surface of the base 28.

Note that an axis of the casing 24 described above is coincident with a rotation axis a1. An upper end part of the casing 24 is formed cylindrically with the rotation axis a1 set to be an axis, and a diameter thereof is slightly smaller than a diameter of the disk-shaped base 28 of the spin base 21. Accordingly, the peripheral edge part of the lower surface of the base 28 is protruded outward from an outer peripheral surface of an upper end part of the casing 24 to surround the outer peripheral surface as seen from below. Consequently, the rinse liquid can be discharged from below toward the peripheral edge part of the lower surface of the base 28. Moreover, the casing 24 includes a slant surface which is opposed obliquely to the lower surface of the flange portion 29 of the spin base 21. The slant surface takes a shape such as a side surface of a truncated cone and a diameter is gradually reduced closer to an upper end (the spin base 21 side). Each of the rinse liquid discharging ports 86 and 87 is opened and disposed on the slant surface, for example.

A rinse liquid supplying portion 85 is connected to each of the rinse liquid discharging ports 86 and 87. The rinse liquid supplying portion 85 is a piping system for supplying the rinse liquid to the respective rinse liquid discharging ports 86 and 87. The rinse liquid supplying portion 85 supplies the rinse liquid when the spin base 21 is rotated. The rinse liquid supplying portion 85 is specifically configured in combination of a rinse liquid supply source 851$d$, a pipe 852$d$ and a switching valve 853$d$.

The rinse liquid supply source 851$d$ is a supply source for supplying the rinse liquid. Here, the rinse liquid supply source 851$d$ supplies pure water as the rinse liquid, for example. The rinse liquid supply source 851$d$ is connected to the respective rinse liquid discharging ports 86 and 87 through a pipe 852$d$ having a switching valve 853$d$ inserted therebetween. The pipe 852$d$ is branched into a plurality of branch pipes inside of the casing 24 and an upper end of each of the branch pipes is connected to each of the rinse liquid discharging ports 86 and 87. When the switching valve 853$d$ is opened, accordingly, the rinse liquid supplied from the rinse liquid supply source 851$d$ is discharged from the respective rinse liquid discharging ports 86 and 87. Note that as the rinse liquid, it is also possible to use pure water, warm water, ozone water, magnetic water, reduced water (hydrogen water), various organic solvents (ion water, IPA (isopropyl alcohol), function water ($CO_2$ water, etc.) or the like.

An inner member 312 (an outer member 313) can receive a processing solution supplied from a nozzle 50 to a substrate 9 and then discharged from the substrate 9 in a state in which it is disposed in an upper position thereof. In a state in which the inner member 312 is disposed in a lower position thereof, moreover, an upper end of the inner member 312 is positioned on a side of the flange portion 29 of the spin base 21.

When the rinse liquid is supplied from the rinse liquid supplying portion 85 to the rinse liquid discharging ports 86 and 87, the rinse liquid is discharged from the rinse liquid discharging ports 86 and 87 toward the lower surface of the flange portion 29 of the spin base 21 and the peripheral edge part of the lower surface of the base 28. The lower surface of the base 28 is cleaned with the rinse liquid discharged toward the peripheral edge part of the lower surface of the base 28. The rinse liquid discharged toward the lower surface of the flange portion 29 advances along the side surface of the base 28 to hit the lower surface of the flange portion 29 while cleaning the side surface. The processing solution is moved to an outside in the radial direction of the spin base 21 along the lower surface of the flange portion 29 by centrifugal force generated by the rotation of the spin base 21 and is discharged from a tip part of the flange portion 29 to the outside of the spin base 21. The inner member 312 disposed in a lower position receives the rinse liquid discharged to the outside of the spin base 21 by an inner peripheral surface of an upper end side part thereof. Consequently, the inner peripheral surface of the inner member 312 is cleaned. However, the switching valve 853$d$ provided in a rinse liquid supplying portion 85 is electrically connected to a controller 130 and is opened/closed under control of the controller 130. In other words, a mode for discharging the rinse liquid from the rinse liquid discharging ports 86 and 87 (specifically, a discharging start timing, a discharging end timing, a discharging flow rate or the like) is controlled by the controller 130. The rinse liquid discharging ports 86 and 87 and the rinse liquid supplying portion 85 form a rinse liquid discharging portion (a "cleaning liquid discharging portion") 85A for discharging the rinse liquid under the control of the controller 130.

<3-2. Operation and Structure of Substrate Processing Device>

Figure 24:
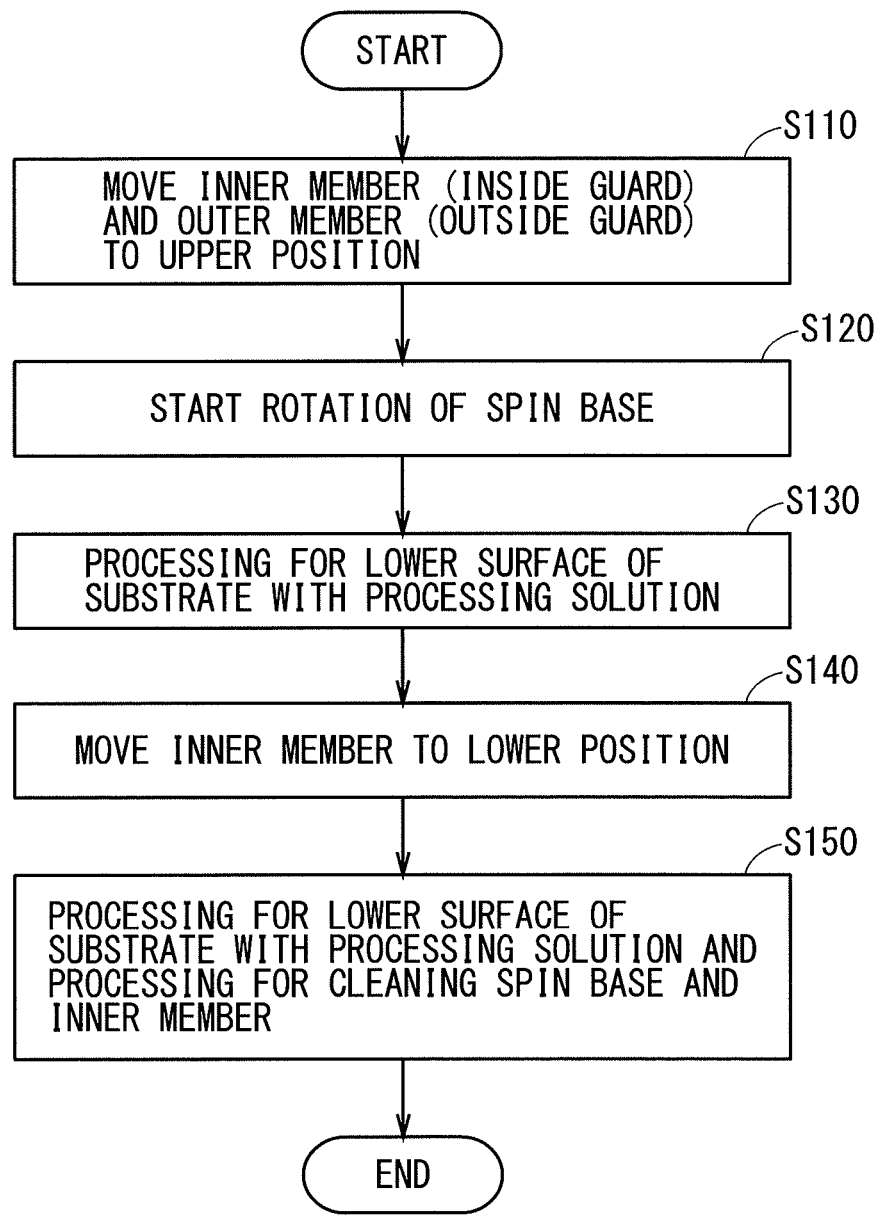
FIG. 24 is a flowchart showing an example of an operation of the substrate processing device according to the third preferred embodiment of the present invention.
Figure 25:
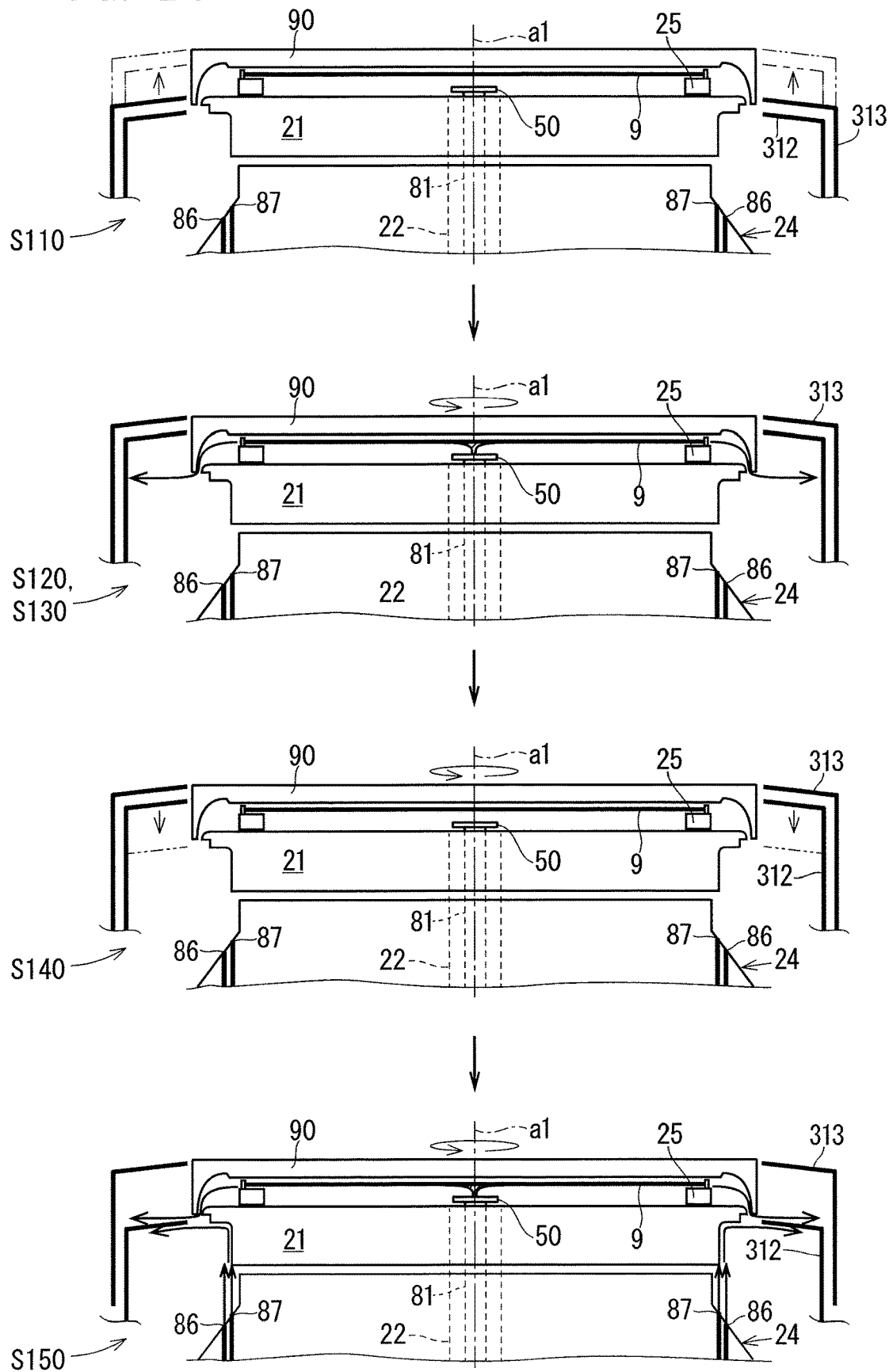
FIG. 25 is a view for explaining the operation shown in the flowchart of FIG. 24.
Figure 26:
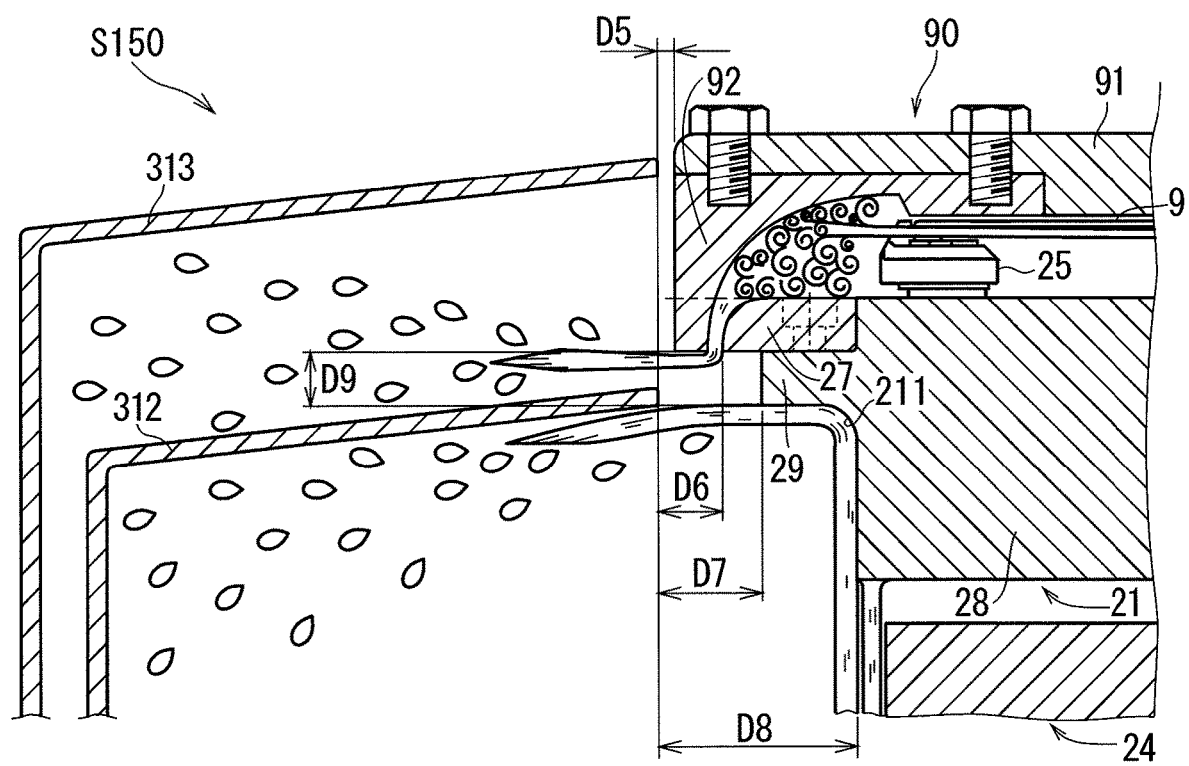
FIG. 26 is a view for explaining an operation of a part of the flowchart in FIG. 24.

FIG. 24 is a flowchart showing an operation for the substrate processing device 1B to perform the processing for the lower surface of the substrate 9 and the processing for cleaning the side surface of the spin base 21 and the inner member 312 by the nozzle 50 and the cleaning portion 6. FIG. 25 is a schematic view for explaining the operation shown in the flowchart of FIG. 24. FIG. 25 shows a longitudinal section of the substrate processing device 1B in accordance with order of the processing in FIG. 24. FIG. 26 is a schematic view for explaining the operation of step S150 in the flowchart of FIG. 24 in more detail. Step S150 is a step for the substrate processing device 1B to perform the cleaning processing by the cleaning portion 6. FIG. 26 shows a longitudinal section of a portion including peripheral edge parts of the shielding plate 90 and the spin base 21, and a part of upper sides of the inner member 312 and the outer member 313 in the substrate processing device 1B. A splash guard 31 has the outer member 313 disposed in an upper position and the inner member 312 disposed in a lower position.

With reference to FIGS. 24 to 26, description will be given to an example of the operation for the substrate processing device 1B to perform the processing for the lower surface of the substrate 9 and the processing for cleaning the side surface of the spin base 21 and the inner member 312. Moreover, description will also appropriately be given to a positional relationship among the shielding plate 90, the spin base 21, the inner member 312 and the outer member 313 or the like. If necessary, reference will also appropriately be made to the other drawings. Here, description will be given to the case in which the nozzle 50 discharges the processing solution to the lower surface of the substrate 9. For example, the processing solution may be supplied from the nozzle provided in the central part of the shielding plate 90 to the upper surface of the substrate 9, thereby processing the upper surface of the substrate 9.

Prior to the start of the operation shown in FIG. 24, the substrate 9 is delivered onto the spin base 21 and is thus held by a chuck pin 25. Moreover, the shielding plate 90 is disposed in a processing position and the inner member 312 and the outer member 313 are disposed in respective lower positions. The rotation of the spin base 21 is stopped and the nozzle 50 and the rinse liquid discharging ports 86 and 87 do not discharge the processing solution and the rinse liquid.

The substrate processing device 1B moves the inner member 312 and the outer member 313 to the respective upper positions from the state in which the inner member 312 and the outer member 313 are disposed in the respective lower positions (step S110). Specifically, the controller 130 controls a guard driving mechanism 32 to move the inner member 312 and the outer member 313 to the respective upper positions and to dispose them in the upper positions. Then, a cover gas nozzle 41 (FIG. 23) of a surface protecting portion 4 preferably starts to discharge a gas (a cover gas) toward the vicinity of a center of the upper surface of the substrate 9 held by the spin base 21.

When the processing of step S110 is completed, the substrate processing device 1B starts the rotation of the spin base 21 (step S120). Specifically, the controller 130 controls the rotational drive 23 to start the rotation of the rotating shaft portion 22. Consequently, the spin base 21 starts the rotation together with the rotating shaft portion 22. The number of rotations of the spin base 21, that is, the substrate 9 is set to be 1000 to 1500 rpm, for example.

Next, the substrate processing device 1B performs the processing for the lower surface of the substrate 9 with the processing solution (step S130). Specifically, the controller 130 selectively opens the switching valves 833a to 833d to cause the processing solution supplying portion 83 to start the supply of a processing solution (SC-1, DHF, SC-2 or a rinse liquid), for example. The processing solution is supplied to the nozzle 50 through a pipe 832a or the like and the nozzle 50 starts to discharge the processing solution toward a to-be-processed surface of the substrate 9 (in a shown example, the lower surface). The processing solution is supplied for 7 to 10 seconds at a flow rate of 600 ml/minute, for example. Then, the controller 130 closes the switching valves 833a to 833d, thereby causing the processing solution supplying portion 83 to stop the supply of the processing solution. Consequently, the nozzle 50 stops the discharge of the processing solution toward the lower surface of the substrate 9.

When the processing solution supplying portion 83 is caused to stop the supply of the processing solution, the substrate processing device 1B moves the inner member 312 to the lower position and thus disposes the inner member 312 in the lower position (step S140). Specifically, the controller 130 causes the guard driving mechanism 32 to move the inner member 312 from the upper position to the lower position and to stop the inner member 312 in the lower position.

When the inner member 312 is disposed in the lower position, an upper end of the inner member 312 is positioned on a side of the lower surface of the flange portion 29. More specifically, a lower surface of the upper end of the inner member 312 is disposed within a range of 25 mm below to 25 mm above with respect to the lower surface in a tip side part of the flange portion 29, for example. Preferably, the lower surface of the upper end of the inner member 312 and the lower surface of the tip side part of the flange portion 29 are disposed on the same level as shown in FIG. 26. When the inner member 312 is disposed in the lower position so that the upper end of the inner member 312 is positioned on the side of the lower surface of the flange portion 29, the inner member 312 can receive the rinse liquid discharged to the outside of the spin base 21 along the lower surface of the flange portion 29 by an inner peripheral surface of an upper end part thereof.

An interval D5 in a horizontal direction between the upper ends of the inner member 312 and the outer member 313 and the outer peripheral surface of the shielding plate 90 is set to be 1 mm to 5 mm, for example. The interval D5 is constant regardless of the up-down movement of the inner member 312 and the outer member 313. Moreover, an interval D6 in the horizontal direction between the upper ends of the inner member 312 and the outer member 313 and a tip of a draining portion 27 is set to be 5 mm to 10 mm, for example. An interval D7 in the horizontal direction between the upper ends of the inner member 312 and the outer member 313 and a tip surface of the flange portion 29 is set to be 15 mm to 25 mm, for example. Moreover, an interval D8 in a horizontal direction between the upper ends of the inner member 312 and the outer member 313 and a side surface of the base 28 is set to be 40 mm, for example. Thicknesses of the upper ends of the inner member 312 and the outer member 313 are approximately 5 mm, for example. The lower surface of the draining portion 27 and a lower end face of an extended portion 92 of the shielding plate 90 are set onto substantially the same level, and an interval D9 in a perpendicular direction between these surfaces and the lower surface of the upper end of the inner member 312 is set to be 10 mm, for example.

The substrate processing device 1B performs the processing for cleaning the side surface of the spin base 21 and the inner peripheral surface of the inner member 312 while carrying out the processing for the lower surface of the substrate 9 with the processing solution in the state in which the inner member 312 is disposed in the lower position (step S150). In other words, the controller 130 causes the rinse liquid discharging ports 86 and 87 to discharge the rinse liquid toward the lower surface of the flange portion 29 of the spin base 21 which holds the substrate 9 and is being rotated in a state in which the guard driving mechanism 32 is caused to dispose the inner member 312 in the lower position. Specifically, the controller 130 opens the switching valve 353d to supply the rinse liquid from the rinse liquid supply source 851d to each of the rinse liquid discharging ports 86 and 87 for 7 to 10 seconds at a flow rate of 600 ml/minute, for example. The rinse liquid is supplied to each of the rinse liquid discharging ports 86 and 87 through the pipe 852d so that each of the rinse liquid discharging ports 86 and 87 discharges the rinse liquid upward in a perpendicular direction.

Note that prior to the start of the supply of the rinse liquid to each of the rinse liquid discharging ports 86 and 87, the controller 130 preferably controls the rotational drive 23 to increase the number of rotations of the spin base 21. Specifically, the number of rotations is set to be approximately 2000 rpm to 2500 rpm, for example. Consequently, the rinse liquid discharged to the lower surface of the flange portion 29 reaches the inner member 312 more easily.

Moreover, the controller 130 controls the processing solution supplying portion 83 to cause the nozzle 50 to discharge the processing solution toward the lower surface of the substrate 9 in the same manner as the processing of step S130 while the rinse liquid is discharged upward in the perpendicular direction from each of the rinse liquid discharging ports 86 and 87 in step S150. The processing solution discharged in step S150 may be the same as or different from the processing solution discharged in step S130.

As shown in FIG. 26, the rinse liquid discharged toward a curved surface 211 of the flange portion 29 flows along the side surface of the base 28 and cleans the side surface. An advancing direction of the rinse liquid reaching the curved surface 211 is changed outward in the radial direction of the spin base 21 by the curved surface 211. The rinse liquid is splashed from the tip of the flange portion 29 toward the upper end side of the inner member 312 by centrifugal force generated by the rotation of the spin base 21. In the case in which the inner member 312 is disposed in the lower position and the upper end thereof is disposed on the side of the lower surface of the tip side part in the flange portion 29, the rinse liquid splashed from the tip of the flange portion 29 is scattered to the inner peripheral surface of the inner member 312 including the lower surface of the upper end side part of the inner member 312 to clean the inner peripheral surface as shown in FIG. 26.

Moreover, the processing solution supplied to the lower surface of the substrate 9 by the nozzle 50 is discharged from the clearance G1 (FIG. 7) between the tip part (the lower end) of the extended portion 92 of the shielding plate 90 and the tip part of the draining portion 27 of the spin base 21 to the outside of the spin base 21. The draining portion 27 is positioned above the flange portion 29, and furthermore, is protruded outward in the radial direction of the spin base 21 from the flange portion 29. Accordingly, the processing solution discharged from the upper surface of the draining portion 27 and the rinse liquid discharged from the lower surface of the flange portion 29 are discharged from the spin base 21 in a state in which they are separated from each other. The processing solution and the rinse liquid which are discharged are scattered outward in the radial direction of the spin base 21 while spreading in a vertical direction in a state in which they are separated from each other by the upper end side part of the inner member 312. The processing solution is received by the outer member 313 disposed in the upper position of the upper surface of the upper end part in the outer member 313. The rinse liquid is received by the inner peripheral surface of the outer member 313 including the inner peripheral surface of the upper end side part of the inner member 312 and cleans the inner peripheral surface.

When the processing in step S150 is ended, the controller 130 causes the processing solution supplying portion 83 and the rinse liquid supplying portion 85 to stop the supply of the processing solution and the rinse liquid, thereby stopping the movement of the inner member 312 and the outer member 313 to the lower positions, the rotation of the spin base 21, or the like.

As described above, the upper surface of the outer peripheral edge part of the draining portion 27 is the curved surface which is convexly curved obliquely upward and outward, and the thickness is gradually reduced closer to the outer peripheral edge part (the tip part) and the outer peripheral edge of the draining portion 27. Accordingly, the processing solution discharged from the clearance G1 is prevented from going round the flange portion 29 side along the lower surface of the draining portion 27. Therefore, the processing solution is prevented from being scattered toward the inner peripheral surface of the inner member 312 in mixture with the rinse liquid discharged from the flange portion 29.

For example, a tip surface of a draining portion 27B (FIG. 13) which will be described below is a perpendicular surface, and the draining portion 27B is also positioned above the flange portion 29, and furthermore, is protruded outward in the radial direction of the spin base 21 from the flange portion 29. Accordingly, the processing solution discharged from the upper surface of the draining portion 27B and the rinse liquid discharged from the lower surface of the flange portion 29 are discharged from the spin base 21 in a state in which they are separated from each other. Even if the draining portion 27B is employed, thus, the usefulness of the present invention is not damaged.

For example, in the case in which the draining portion 27 (27B) is not provided, a part of the processing solution emitted to the substrate 9 and discharged from the spin base 21 via the substrate 9 goes round the lower surface side of the flange portion 29. In this case, the processing solution going round is emitted from below toward the lower surface of the flange portion and is discharged from the spin base 21 in mixture with the rinse liquid discharged along the lower surface. If the same rinse liquid as the rinse liquid supplied by the rinse liquid supplying portion 85 is employed as the processing solution to be supplied to the substrate 9, however, it is possible to simultaneously clean the substrate 9 and to clean the inner peripheral surface of the inner member 312 with the rinse liquid without causing a problem of the mixture. Even if the draining portion 27 (27B) is not provided, accordingly, the usefulness of the present invention is not damaged.

Moreover, if the processing solution is not discharged from the nozzle 50 but the rinse liquid is discharged from the rinse liquid discharging ports 86 and 87 in step S150, for example, the processing solution sticking to the substrate 9 and remaining can be removed by the high speed rotation of the substrate 9, thereby drying the substrate 9 in step S130. In this case, the processing solution in a large amount is not discharged from the spin base 21 via the substrate 9 in step S150. Also in the case in which the outer member 313 is not provided, accordingly, it is possible to clean the side surface of the spin base 21 and to clean the inner peripheral surface of the inner member 312 by the rinse liquid discharging ports 86 and 87 in step S150. Even if the outer member 313 is not provided, therefore, the usefulness of the present invention is not damaged.

In addition, the curved surface 211 is not formed on the lower surface of the base end part of the flange portion 29 and the lower surface of the flange portion 29 and the side surface of the base 28 may be substantially orthogonal to each other, for example. Also in this case, the rinse liquid discharged to the lower surface of the flange portion 29 is discharged from the tip of the flange portion 29 toward the inner peripheral surface of the inner member 312 by the centrifugal force generated by the rotation of the spin base 21.

Also in the case in which each rinse liquid discharging port 87 does not discharge the rinse liquid toward the peripheral edge part of the lower surface of the spin base 21, moreover, it is possible to clean the side surface of the spin base 21 and to clean the inner peripheral surface of the inner member 312 if each rinse liquid discharging port 86 discharges the rinse liquid toward the lower surface of the flange portion 29. Even if each rinse liquid discharging port 87 is not provided, accordingly, the usefulness of the present invention is not damaged.

Furthermore, only the spin base 21 in the spin base 21, the rinse liquid discharging ports 86 and 87 and the inner member 312 is rotated around the rotation axis a1. For this reason, it is preferable that a large number of rinse liquid discharging ports 86 be distributed and disposed in the circumferential direction of the spin base 21 because the inner peripheral surface of the inner member 312 can be cleaned more uniformly. Even if only one rinse liquid discharging port 86 is provided, however, the side surface of the spin base 21 and the inner peripheral surface of the inner member 312 can be cleaned simultaneously. Therefore, the usefulness of the present invention is not damaged.

By any of the substrate processing method according to the third preferred embodiment described above and the substrate processing device according to the third preferred embodiment having the structure described above, the processing solution discharging portion 83A discharges the processing solution toward the to-be-processed surface of the substrate 9 in a state in which the inner member 312 is disposed in the upper position where the processing solution discharged from the substrate 9 can be received. In the state in which the inner member 312 is disposed in the lower position where the upper end of the inner member 312 is placed on the side of the flange portion 29 of the spin base 21, then, the rinse liquid discharging portion 85A discharges the rinse liquid toward the flange portion 29 of the spin base 21 which holds the substrate 9 and is being rotated. The discharged rinse liquid is discharged outward in the radial direction of the spin base 21 from the lower surface of the flange portion 29. The upper end of the inner member 312 disposed in the lower position is positioned on the side of the flange portion 29. Therefore, the discharged processing solution hits the inner peripheral surface of the upper end part of the inner member 312. In the state in which the substrate 9 is held by the spin base 21, consequently, both the inner member 312 and the spin base 21 which have the processing solution sticking thereto can be cleaned by the common rinse liquid discharging portion 85A.

By any of the substrate processing method according to the third preferred embodiment described above and the substrate processing device according to the third preferred embodiment having the structure described above, moreover, the draining portion 27 is positioned above the flange portion 29 and is protruded outward in the radial direction of the spin base 21 from the flange portion 29. The rinse liquid discharged to the flange portion 29 from below is moved to the tip of the flange portion 29 along the lower surface of the flange portion 29 and is discharged outward in the radial direction of the spin base 21 from the tip. The processing solution emitted to the to-be-processed surface of the substrate 9 and discharged from the substrate 9 is discharged outward in the radial direction from the rinse liquid via the upper surface of the draining portion 27 and outward in the radial direction of the spin base 21 from above. Accordingly, the processing solution and the rinse liquid are discharged from the spin base 21 in the state in which they are separated from each other. Therefore, it is possible to prevent the discharged processing solution and rinse liquid from being mixed with each other.

By any of the substrate processing method according to the third preferred embodiment described above and the substrate processing device according to the third preferred embodiment having the structure described above, furthermore, the rinse liquid discharging portion 85A discharges the rinse liquid toward the curved surface 211 of the flange portion 29 from below. The curved surface 211 smoothly connects to the outer peripheral surface of the base 28 of the spin base 21 and the lower surface of the flange portion 29, respectively. By decreasing the rinse liquid discharged to the curved surface 211 and then splashed back downward, accordingly, it is possible to discharge the rinse liquid in a larger amount along the lower surface of the flange portion 29. Consequently, the inner peripheral surface of the inner member 312 can be cleaned more efficiently.

By any of the substrate processing method according to the third preferred embodiment described above and the substrate processing device according to the third preferred embodiment having the structure described above, moreover, the inner member 312 is disposed in the lower position, and furthermore, the outer member 313 is disposed in the position where the processing solution supplied from the processing solution discharging portion 83A to the substrate 9 and then discharged from the substrate 9 can be received. In this state, the processing solution is discharged toward the to-be-processed surface of the substrate 9 and the rinse liquid is discharged toward the lower surface of the flange portion 29. Accordingly, it is possible to simultaneously perform the processing for the substrate 9 and the processing for cleaning the spin base 21 and the inner member 312.

By any of the substrate processing method according to the third preferred embodiment described above and the substrate processing device according to the third preferred embodiment having the structure described above, furthermore, the spin base 21 and the inner member 312 can be cleaned in the state in which a sealing property of shielding plate 90 to seal the substrate 9 is enhanced. Therefore, the upper surface of the substrate 9 can further be protected.

While the invention has been shown and described in detail, the foregoing description is in all aspects illustrative and not restrictive. It is therefore understood that numerous modifications and variations can be devised without departing from the scope of the invention.

What is claimed is:

1. A substrate processing device comprising:
   a holding member having an upper surface opposed to a lower surface of a substrate with a clearance to hold said substrate horizontally from below, being rotatable around a predetermined rotation axis, and including a disk-shaped base defining a central axis coincident with said rotation axis and a flange portion protruding outward from a peripheral wall portion of said base in a radial direction;
   a rotational drive rotating said holding member around said rotation axis;
   a guard having a cylindrical shape including an upper end side part that extends obliquely upward toward said rotation axis to surround a periphery of said holding member, being movable upward and downward;

a processing solution discharging portion capable of discharging a processing solution to a to-be-processed surface of said substrate;

a cleaning liquid discharging portion capable of discharging a cleaning liquid to said flange portion from below said flange portion of said holding member;

an elevation drive capable of moving said guard upward and downward between an upper position where said guard can receive said processing solution supplied from said processing solution discharging portion to said substrate and then discharged from said substrate and a lower position where an upper end of said guard is placed on a side of said flange portion; and a controller controlling said elevation drive, said processing solution discharging portion and said cleaning liquid discharging portion, wherein while making said elevation drive dispose said guard in said lower position, said controller makes said cleaning liquid discharging portion discharge said cleaning liquid toward said flange portion of said holding member which holds said substrate while rotating.

2. The substrate processing device according to claim 1, wherein said holding member further includes, on an upper side of said flange portion, an upper flange portion protruding more outward than said flange portion in a radial direction of said holding member from an upper end of said peripheral wall portion of said base.

3. The substrate processing device according to claim 1, wherein said holding member includes, in a base end part of said flange portion, a curved surface portion which has a sectional shape of a circular arc and smoothly connects to an outer peripheral surface of said base of said holding member and a lower surface of said flange portion, and said cleaning liquid discharging portion discharges said cleaning liquid toward said curved surface portion of said flange portion from below.

4. The substrate processing device according to claim 1 further comprising:

a cylindrical outside guard provided outside said guard, surrounding said periphery of said holding member and capable of being moved upward and downward, wherein said elevation drive can also move said outside guard upward and downward, and while making said elevation drive dispose said guard in said lower position and dispose said outside guard in a position where said outside guard can receive said processing solution supplied from said processing solution discharging portion to said substrate and then discharged from said substrate, said controller makes said processing solution discharging portion discharge said processing solution toward said to-be-processed surface of said substrate and makes said cleaning liquid discharging portion discharge said cleaning liquid toward a lower surface of said flange portion.

5. The substrate processing device according to claim 1 further comprising:

an opposed member being rotated around said rotation axis, wherein said opposed member includes a body portion opposed, with a clearance, to an upper surface of said substrate held by said holding member and a cylindrical extended portion extending from a peripheral edge part of said body portion toward said holding member side to surround an end face of said substrate.

6. A substrate processing method comprising:

a holding step of holding a substrate with a substrate holding portion having a flange portion;

a rotation step of rotating said substrate;

a supplying step of supplying a processing solution to said substrate;

a receiving step of receiving said processing solution with a guard; and a cleaning step of cleaning said processing solution adhered to said guard by supplying a cleaning liquid to said flange portion from below said flange portion;

wherein in said supplying step, said processing solution is discharged toward said substrate while said guard is disposed in an upper position where said guard can receive said processing solution discharged from said substrate, and in said cleaning step, said cleaning liquid is discharged toward said flange portion of said substrate holding portion which holds said substrate while rotating while said guard is disposed in a lower position where an upper end of said guard is placed on a side of said flange portion;

further comprising:

a step of making a body portion of an opposed member having said body portion and a cylindrical extended portion be opposed, with a clearance, to an upper surface of said substrate held by said substrate holding portion; and a step of rotating said opposed member around said rotation axis.

* * * * *